US007548023B2

(12) United States Patent
Yamazaki et al.

(10) Patent No.: US 7,548,023 B2
(45) Date of Patent: Jun. 16, 2009

(54) EL DISPLAY DEVICE AND A METHOD OF MANUFACTURING THE SAME

(75) Inventors: Shunpei Yamazaki, Tokyo (JP); Kunitaka Yamamoto, Kanagawa (JP); Masaaki Hiroki, Kanagawa (JP); Takeshi Fukunaga, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/909,120

(22) Filed: Jul. 30, 2004

(65) Prior Publication Data

US 2005/0012445 A1    Jan. 20, 2005

Related U.S. Application Data

(62) Division of application No. 09/685,698, filed on Oct. 10, 2000.

(30) Foreign Application Priority Data

Oct. 12, 1999  (JP) ................................. 11-290356
Oct. 22, 1999  (JP) ................................. 11-301770

(51) Int. Cl.
  *H05B 33/04* (2006.01)
(52) U.S. Cl. ...................... 313/512; 313/505
(58) Field of Classification Search ......... 313/498–512; 445/24; 315/169.3; 345/36, 45, 76
See application file for complete search history.

(56) References Cited

U.S. PATENT DOCUMENTS

| | | | |
|---|---|---|---|
| 3,484,793 A | 12/1969 | Weigl | 347/2 |
| 3,878,517 A | 4/1975 | Kasubuchi et al. | 346/75 |
| 4,067,020 A | 1/1978 | Arway | 347/7 |
| 4,281,332 A | 7/1981 | Horike | 346/75 |
| 4,357,557 A | 11/1982 | Inohara et al. | |
| 4,737,803 A | 4/1988 | Fujimura et al. | 346/140 |

(Continued)

FOREIGN PATENT DOCUMENTS

CN    1212114 A    3/1999

(Continued)

OTHER PUBLICATIONS

Schenk, H. et al., "Polymers for Light Emitting Diodes," EURODISPLAY '99, Proceedings of the 19th International Display Research Conference, Sep. 6-9, 1999, Berlin, Germany, pp. 33-37, (1999).

(Continued)

*Primary Examiner*—Nimeshkumar D. Patel
*Assistant Examiner*—Christopher M. Raabe
(74) *Attorney, Agent, or Firm*—Cook Alex Ltd.

(57) ABSTRACT

To provide a high throughput film deposition means for film depositing an organic EL material made of polymer accurately and without any positional shift. A pixel portion is divided into a plurality of pixel rows by a bank, and a head portion of a thin film deposition apparatus is scanned along a pixel row to thereby simultaneously apply a red light emitting layer application liquid, a green light emitting layer application liquid, and a blue light emitting layer application liquid in stripe shapes. Heat treatment is then performed to thereby form light emitting layers luminescing each of the colors red, green, and blue.

40 Claims, 23 Drawing Sheets

U.S. PATENT DOCUMENTS

| | | | |
|---|---|---|---|
| 4,788,629 A * | 11/1988 | Handy et al. | 362/23 |
| 4,882,518 A * | 11/1989 | Cherry | 313/512 |
| 4,951,064 A * | 8/1990 | Kun et al. | 347/238 |
| 4,994,540 A * | 2/1991 | Boerner et al. | 528/44 |
| 4,999,229 A * | 3/1991 | Moritani et al. | 428/36.6 |
| 5,059,148 A * | 10/1991 | McKenna et al. | 445/25 |
| 5,189,405 A * | 2/1993 | Yamashita et al. | 313/512 |
| 5,247,190 A | 9/1993 | Friend et al. | 257/40 |
| 5,278,223 A * | 1/1994 | Gruenewaelder et al. | 524/502 |
| 5,304,419 A * | 4/1994 | Shores | 428/355 R |
| 5,334,539 A | 8/1994 | Shinar et al. | 437/1 |
| 5,399,502 A | 3/1995 | Friend et al. | 437/1 |
| 5,608,251 A | 3/1997 | Konuma et al. | 257/337 |
| 5,620,905 A | 4/1997 | Konuma et al. | 438/163 |
| 5,643,826 A | 7/1997 | Ohtani et al. | 437/88 |
| 5,663,573 A * | 9/1997 | Epstein et al. | 257/40 |
| 5,684,365 A | 11/1997 | Tang et al. | 315/169.3 |
| 5,714,195 A | 2/1998 | Shiba et al. | 427/140 |
| 5,736,754 A | 4/1998 | Shi et al. | |
| 5,747,930 A * | 5/1998 | Utsugi | 313/504 |
| 5,757,396 A | 5/1998 | Bruner | 347/27 |
| 5,770,892 A * | 6/1998 | Chan et al. | 257/393 |
| 5,817,366 A | 10/1998 | Arai et al. | 427/66 |
| 5,821,003 A | 10/1998 | Uemura et al. | 428/690 |
| 5,834,894 A | 11/1998 | Shirasaki et al. | |
| 5,839,456 A | 11/1998 | Han | 134/104.1 |
| 5,844,538 A | 12/1998 | Shiraki et al. | 345/98 |
| 5,869,929 A | 2/1999 | Eida et al. | |
| 5,882,761 A | 3/1999 | Kawami et al. | 428/69 |
| 5,920,080 A * | 7/1999 | Jones | 257/40 |
| 5,923,962 A | 7/1999 | Ohtani et al. | 438/150 |
| 5,928,794 A * | 7/1999 | Kalinowski et al. | 428/447 |
| 5,932,327 A | 8/1999 | Inoguchi et al. | |
| 5,962,962 A | 10/1999 | Fujita et al. | 313/412 |
| 5,972,419 A | 10/1999 | Roitman | 427/66 |
| 5,981,092 A | 11/1999 | Arai et al. | |
| 5,985,356 A | 11/1999 | Schultz et al. | 427/8 |
| 5,990,615 A | 11/1999 | Sakaguchi et al. | |
| 6,013,982 A | 1/2000 | Thompson et al. | 313/506 |
| 6,049,167 A | 4/2000 | Onitsuka et al. | |
| 6,057,647 A | 5/2000 | Kurosawa et al. | 315/169.3 |
| 6,087,771 A | 7/2000 | Roitman | 313/503 |
| 6,104,137 A | 8/2000 | Abiko et al. | |
| 6,117,529 A | 9/2000 | Leising et al. | |
| 6,134,020 A | 10/2000 | Masumoto et al. | |
| 6,134,578 A | 10/2000 | Masumoto et al. | 358/1.16 |
| 6,150,187 A | 11/2000 | Zyung et al. | |
| 6,198,217 B1 | 3/2001 | Suzuki et al. | |
| 6,220,912 B1 | 4/2001 | Shigeoka et al. | 445/24 |
| 6,226,890 B1 | 5/2001 | Boroson et al. | |
| 6,251,712 B1 | 6/2001 | Tanaka et al. | 438/143 |
| 6,268,295 B1 | 7/2001 | Ohta et al. | |
| 6,274,887 B1 | 8/2001 | Yamazaki et al. | 257/72 |
| 6,274,979 B1 | 8/2001 | Gelii et al. | |
| 6,277,679 B1 | 8/2001 | Ohtani | 438/151 |
| 6,320,309 B1 | 11/2001 | Nomura et al. | |
| 6,365,917 B1 | 4/2002 | Yamazaki | 257/72 |
| 6,373,453 B1 | 4/2002 | Yudasaka | 345/76 |
| 6,380,007 B1 | 4/2002 | Koyama | 438/151 |
| 6,392,340 B2 | 5/2002 | Yoneda et al. | |
| 6,394,578 B1 | 5/2002 | Akahira et al. | 347/43 |
| 6,424,326 B2 | 7/2002 | Yamazaki et al. | 345/77 |
| 6,440,877 B1 | 8/2002 | Yamazaki et al. | 438/780 |
| 6,447,867 B1 | 9/2002 | Kominami et al. | |
| 6,468,715 B2 | 10/2002 | Hoffend et al. | |
| 6,469,758 B2 | 10/2002 | Yu | |
| 6,476,783 B2 | 11/2002 | Matthies et al. | |
| 6,506,635 B1 | 1/2003 | Yamazaki et al. | 438/148 |
| 6,528,951 B2 | 3/2003 | Yamazaki et al. | |
| 6,531,713 B1 | 3/2003 | Yamazaki | 257/59 |
| 6,545,359 B1 | 4/2003 | Ohtani et al. | 257/758 |
| 6,548,960 B2 | 4/2003 | Inukai | 315/169.3 |
| 6,583,776 B2 | 6/2003 | Yamazaki et al. | 345/77 |
| 6,585,910 B1 | 7/2003 | Kikuyama et al. | 252/79.3 |
| 6,605,826 B2 | 8/2003 | Yamazaki et al. | |
| 6,611,108 B2 | 8/2003 | Kimura | 315/169.3 |
| 6,617,644 B1 | 9/2003 | Yamazaki et al. | |
| 6,650,045 B1 | 11/2003 | Forrest et al. | |
| 6,674,136 B1 | 1/2004 | Ohtani | 257/408 |
| 6,690,033 B2 | 2/2004 | Yamazaki et al. | 257/72 |
| 6,696,105 B2 | 2/2004 | Hiroki et al. | 427/466 |
| 6,699,739 B2 | 3/2004 | Yamazaki et al. | 438/156 |
| 6,702,407 B2 | 3/2004 | Azami | 305/204 |
| 6,714,178 B2 | 3/2004 | Koyama et al. | 345/76 |
| 6,737,176 B1 | 5/2004 | Otsuki et al. | |
| 6,747,638 B2 | 6/2004 | Yamazaki et al. | 345/207 |
| 6,750,835 B2 | 6/2004 | Azami | 345/89 |
| 6,756,740 B2 | 6/2004 | Inukai | 315/169.3 |
| 6,759,678 B2 | 7/2004 | Yamazaki et al. | 257/59 |
| 6,770,502 B2 | 8/2004 | Cok et al. | |
| 6,776,844 B2 | 8/2004 | Yonekura et al. | 118/621 |
| 6,781,746 B2 | 8/2004 | Yamazaki et al. | 359/321 |
| 6,784,037 B2 | 8/2004 | Yamazaki et al. | 438/199 |
| 6,797,980 B2 | 9/2004 | Takiguchi et al. | 257/40 |
| 6,821,553 B2 | 11/2004 | Miyashita et al. | |
| 6,830,494 B1 | 12/2004 | Yamazaki et al. | 445/24 |
| 6,833,156 B2 | 12/2004 | Miyashita et al. | |
| 6,833,668 B1 | 12/2004 | Yamada et al. | 313/505 |
| 6,838,192 B2 | 1/2005 | Miyashita et al. | |
| 6,863,961 B2 | 3/2005 | Miyashita et al. | |
| 6,911,772 B2 | 6/2005 | Cok | |
| 7,298,347 B2 | 11/2007 | Yamazaki et al. | |
| 2001/0001050 A1 | 5/2001 | Miyashita et al. | 428/690 |
| 2001/0023661 A1 | 9/2001 | Hiroki et al. | 118/300 |
| 2002/0005696 A1* | 1/2002 | Yamazaki et al. | 315/169.3 |
| 2002/0009536 A1 | 1/2002 | Iguchi et al. | 427/10 |
| 2002/0024051 A1 | 2/2002 | Yamazaki et al. | |
| 2002/0041926 A1 | 4/2002 | Miyashita et al. | 427/66 |
| 2002/0075422 A1 | 6/2002 | Kimura et al. | 349/43 |
| 2002/0136823 A1 | 9/2002 | Miyashita et al. | |
| 2002/0197394 A1 | 12/2002 | Yamazaki et al. | 427/66 |
| 2003/0003231 A1 | 1/2003 | Kiguchi et al. | 427/282 |
| 2003/0173897 A1 | 9/2003 | Iwase et al. | |
| 2003/0196597 A1 | 10/2003 | Yamazaki et al. | 118/300 |
| 2003/0230972 A1 | 12/2003 | Cok | |
| 2004/0048001 A1 | 3/2004 | Kiguchi et al. | 427/421 |
| 2004/0079923 A1 | 4/2004 | Yamazaki et al. | |
| 2005/0012445 A1 | 1/2005 | Yamazaki et al. | 315/500 |
| 2005/0035708 A1 | 2/2005 | Yamazaki et al. | 313/505 |
| 2005/0042477 A1 | 2/2005 | Miyashita et al. | |
| 2005/0082970 A1 | 4/2005 | Yamazaki et al. | 313/506 |
| 2006/0180826 A1 | 8/2006 | Yamazaki et al. | |

FOREIGN PATENT DOCUMENTS

| | | |
|---|---|---|
| DE | 19918193 | 11/1999 |
| EP | 0 347 058 | 12/1989 |
| EP | 0 683 406 | 11/1995 |
| EP | 0 717 446 | 6/1996 |
| EP | 0 756 932 | 2/1997 |
| EP | 0 776 147 | 5/1997 |
| EP | 0 781 075 | 6/1997 |
| EP | 0845770 | 6/1998 |
| EP | 0 859 539 | 8/1998 |
| EP | 0 862 156 | 9/1998 |
| EP | 0 880 303 | 11/1998 |
| EP | 0 883 191 | 12/1998 |
| EP | 0 892 028 | 1/1999 |
| EP | 0 893 939 A1 | 1/1999 |
| EP | 0 903 778 A1 | 3/1999 |
| EP | 0 930 641 | 7/1999 |
| EP | 0 940 796 | 9/1999 |
| EP | 0 999 595 | 5/2000 |
| EP | 1 093 156 | 4/2001 |

| | | |
|---|---|---|
| EP | 1 093 166 | 4/2001 |
| EP | 1 211 916 A1 | 6/2002 |
| EP | 1 376 716 A2 | 1/2004 |
| EP | 1 376 717 A2 | 1/2004 |
| GB | 2 336 553 | 10/1999 |
| JP | 62-090260 | 4/1987 |
| JP | 63-131494 | 6/1988 |
| JP | 64-40888 | 2/1989 |
| JP | 5-94879 | 4/1993 |
| JP | 07-130652 | 5/1995 |
| JP | 07-135323 | 5/1995 |
| JP | 7-272848 | 10/1995 |
| JP | 08-078159 | 3/1996 |
| JP | 08-085203 | 4/1996 |
| JP | 08-166775 | 6/1996 |
| JP | 08-234683 | 9/1996 |
| JP | 08-330602 | 12/1996 |
| JP | 9-22779 | 1/1997 |
| JP | 09-148066 | 6/1997 |
| JP | 09-194831 | 7/1997 |
| JP | 10-012377 | 1/1998 |
| JP | 10-060331 | 3/1998 |
| JP | 10-092576 | 4/1998 |
| JP | 10-134959 | 5/1998 |
| JP | 10-153967 | 6/1998 |
| JP | 10-189238 | 7/1998 |
| JP | 10-189252 | 7/1998 |
| JP | 10-189525 | 7/1998 |
| JP | 10-270363 | 10/1998 |
| JP | 10-275682 | 10/1998 |
| JP | 11-016679 | 1/1999 |
| JP | 11-025852 | 1/1999 |
| JP | 11-40346 | 2/1999 |
| JP | 11-054270 | 2/1999 |
| JP | 11-054272 | 2/1999 |
| JP | 11-268296 | 10/1999 |
| JP | 2000-173766 | 6/2000 |
| JP | 2000208251 A * | 7/2000 |
| JP | 2000-340798 | 12/2000 |
| JP | 2002-72964 | 3/2002 |
| WO | WO 90/13148 | 11/1990 |
| WO | WO 98/24271 | 6/1998 |
| WO | WO 98/27579 | 6/1998 |
| WO | WO 99/10861 | 3/1999 |
| WO | WO 99/21233 | 4/1999 |
| WO | WO 99/039224 A1 | 8/1999 |
| WO | 1 093 167 | 4/2001 |
| WO | 1 122 801 | 8/2001 |

OTHER PUBLICATIONS

U.S. Appl. No. 09/685,912 (pending) to Yamazaki et al, including specification, abstract, claims, drawings and PTO filing receipt.
U.S. Appl. No. 09/776,472 (pending) to Yamazaki et al, including specification, abstract, claims, drawings and PTO filing receipt.
Wu, C.C. et al, "Integration of Organic LED's and Amorphous Si TFT's Onto Unbreakable Metal Foil Substrates," International Electron Devices Meeting, San Francisco, CA, Dec. 8-11, 1996, IDEM 1996 Technical Digest, pp. 957-959, (1996).
Shim, H. et al, "Electrical and Optical Polymer Systems," Donald L. Wise, ed., p. 938, (1998).
Hart, J.A. et al, "A History of Electroluminscent Displays," http://www.indiana.edu/~hightech/fpd/papers/ELDs.html pp. 1-18 (1999).
European Search Report re application No. EP 00122446.8, dated Jun. 26, 2001.
EPO Office Action re application No. EP 00122446.8, dated Nov. 4, 2003.
European Search Report re application No. EP 00113577.1, dated Mar. 1, 2004.
European search report re application No. EP 01102402.3, dated Apr. 25, 2005.
U.S. Appl. No. 11/399,024 to Yamazaki filed Apr. 5, 2006, including specification, abstract, claims, drawings and PTO filing receipt.
Specification of U.S. Appl. No. 09/685,912 to S. Yamazaki, filed Oct. 10, 2000 (abandoned).
Office Action re Korean Patent Application No. KR 2007-0048753, dated Aug. 16, 2007 (with English translation).
Office Action re Chinese application No. CN 200610081922.5, dated Oct. 10, 2008 (with English translation).

* cited by examiner

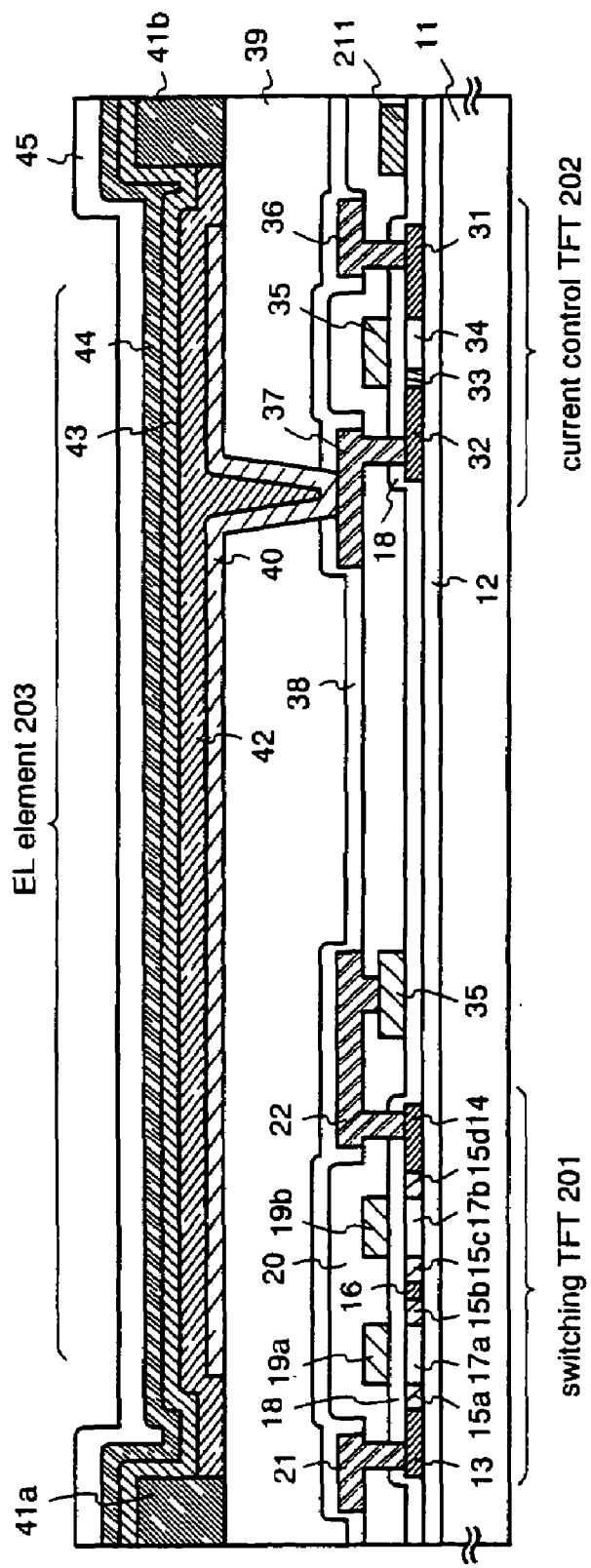

Fig.2

11:substrate 12:base film 13:source region 14:drain region 15a-15d:LDD regions
16:high concentration impurity regions 7a,17b:channel forming region
18:gate insulating film 19a, 19b:gate electrodes 20:first interlayer insulating film
21:source wiring 22:drain wiring 23:gate electrode 31:source region 32:drain region
33:LDD region 34:channel forming region 35:gate electrode 36:source wiring
37:drain wiring 38:first passivation film 39:second interlayer insulating film
40:pixel electrode(cathod) 41:bank 42:light emitting layer 43:hole injection layer
44:anode 45:second interlayer insulating film 300:glass substrate 301:base film 302:polysilicon film 303:protective film 304a-304b resist mask
305,306:n-type inpurity regions 307-310:active layers 311:gate insulating film 312-316:gate electodes 317-323:n-type impurity regions 324a-324c,332:resisit mask 325-331:n-type impurity regions
333,334:p-type impurity regions 335:gate wiring 701:substrate 702:pixel portion 703:gate side driver circuit
704:source side diver circuit 705:switching TFT 706:gate wiring
707:source wiring 708:current control TFT 709:current supply line
710:EL element 711:FPC 712-714:connection wiring

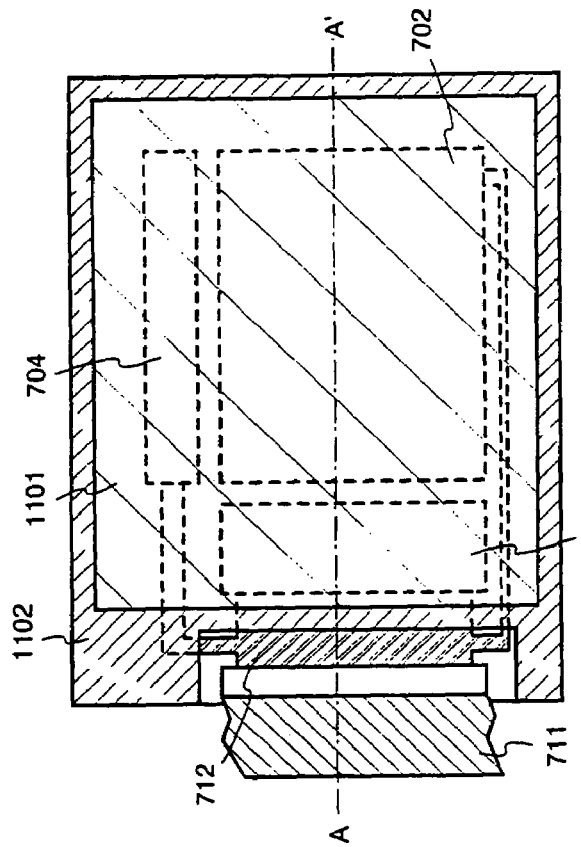
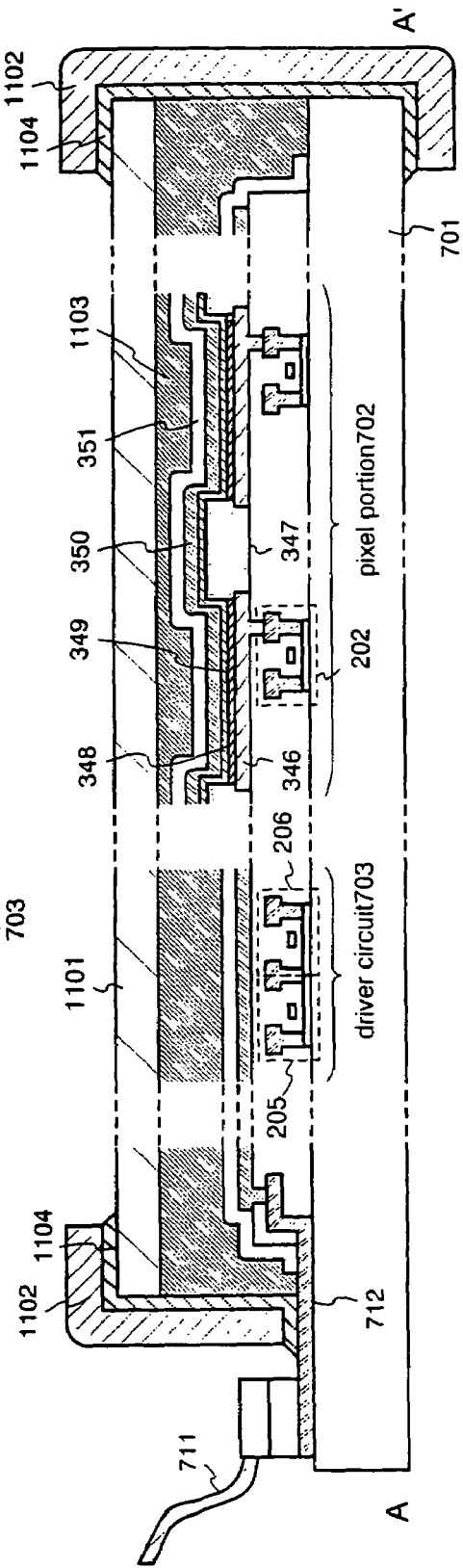
Fig.11A
Fig.11B

EL DISPLAY DEVICE AND A METHOD OF MANUFACTURING THE SAME

CROSS-REFERENCE TO RELATED APPLICATIONS

This application is a divisional of U.S. application Ser. No. 09/685,698, filed Oct. 10, 2000, and claims priority to Japanese Patent Applications 11-290356, filed Oct. 12, 1999, and 11-301770, filed Oct. 22, 1999.

BACKGROUND OF THE INVENTION

1. Field of the Invention

The present invention relates to an EL display device comprising an EL element, which is constructed of a light emitting organic material capable of obtaining EL (Electro Luminescence)(hereinafter referred to as organic EL material) sandwiched between an anode and a cathode, that is formed on a substrate, and to a method of manufacturing an electronic device (electronic equipment) having the El display device as a display portion (a display or a display monitor). It is to be noted that the above-mentioned EL display device is also referred to as OLED (Organic Light Emitting Diodes).

2. Description of the Related Art

In recent years, the development of a display device (EL display device) employing an EL element as a self-emissive element that utilizes the EL phenomenon of a light emitting organic material is proceeding. Since the EL display device is a self-emissive type, it does not need a backlight such as the liquid crystal display device. Furthermore, because the viewing angle of EL display devices is wider, it is perceived as a prospective display portion of mobile equipment for use outdoors.

There are two types of EL display devices, the passive type (simple matrix type) and the active type (active matrix type). Developments for both types of EL display devices are being actively carried out. In particular, the active matrix EL display device is currently attracting much attention. Researches are being made on low molecular organic EL materials and high molecular organic EL materials (organic polymer EL materials) as to organic EL materials for forming a light emitting layer which can be regarded as the core of the EL element. High molecular organic EL materials are receiving much attention because they are easier to deal with than low molecular organic EL materials and have high heat resistant characteristics.

As a film deposition method of high molecular organic EL materials, the ink-jet method proposed by Seiko Epson, Co. Ltd. is considered a favorable method. Japanese Patent Application Laid-open No. Hei 10-12377, Japanese Patent Application Laid-open No. Hei 10-153967, and Japanese Patent Application Laid-open No. Hei 11-54270 etc. may be referred to regarding this technique.

However, in the ink-jet method, the high molecular organic EL material is sprayed on the application surface. Hence, if the distance between the application surface and the nozzle of the ink-jet head is not set appropriately, drops of solution will be shot to parts that the application is not necessary, resulting in the occurrence of a problem what is known as an aviation curve. Note that details regarding the aviation curve are disclosed in the above-mentioned Japanese Patent Application Laid-open No. Hei 11-54270, in which 50 µm or more of slip occurs from the positional target of shot.

SUMMARY OF THE INVENTION

The present invention has been made in view of the above problem, and an object thereof is to provide a high throughput film deposition means for film depositing an organic EL material made of polymer accurately and without any positional shift. Another object of the present invention is to provide an EL display device employing such means and a method of manufacturing the same. Still further, another object of the present invention is to provide electronic equipment having such EL display devices as its display portion.

In order to achieve the above objects, the present invention is characterized in that red, green, and blue light emitting layers are formed into stripe shapes by using a dispenser-like thin film deposition apparatus. It is to be noted that stripe shapes include a long and narrow rectangle having an aspect ratio of 2 or greater, and a long and narrow ellipse having the ratio of its major axis and minor axis equal to 2 or greater. The thin film deposition apparatus of the present invention is shown in FIG. 1.

FIG. 1A is a diagram schematically showing the state of the film deposition of an organic EL material made of π conjugate-based polymer when the present invention is implemented. In FIG. 1A, a pixel portion 111, a source side driver circuit 112, and a gate side driver circuit 113, all formed of TFTs, are formed on a substrate 110. A region surrounded by a plurality of source wirings connected to the source side driver circuit 112 and a plurality of gate wirings connected to the gate side driver circuit 113 is a pixel. A TFT and an EL element electrically connected to the TFT are formed in the pixel. Thus, the pixel portion 111 is formed of such pixels arranged in matrix.

Here, reference numeral 114a denotes a mixture of an organic EL material luminescing red and a solvent (hereinafter referred to as a red light emitting layer application liquid); 114b denotes a mixture of an organic EL material luminescing green and a solvent (hereinafter referred to as a green light emitting layer application liquid); and 114c denotes a mixture of an organic EL material luminescing blue and a solvent (hereinafter referred to as a blue light emitting layer application liquid). Note that a polymer is the organic EL material for these application liquids, and that there is a method of directly dissolving a polymerized material into the solvent for application, or a method of performing thermal polymerization to a material, which is formed by dissolving monomer in a solvent and then by performing film deposition, to form a polymer. Whichever method may be used in the present invention. An example of applying an organic EL material processed into a polymer and dissolved in a solvent is shown here.

In the case of the present invention, the red light emitting layer application liquid 114a, the green light emitting layer application liquid 114b, and the blue light emitting layer application liquid 114c are separately discharged from the thin film deposition apparatus and applied in the direction indicated by the arrow. In other words, in a pixel row that will luminesce red, a pixel row that will luminesce green, and a pixel row that will luminesce blue, stripe shape light emitting layers (strictly a precursor of a light emitting layer) are simultaneously formed.

Note that the pixel row referred here indicates a row of pixel partitioned by a bank 121 that is formed on the upper part of the source wiring. That is, a row composed of a plurality of pixels lined up in series along the source wiring is called a pixel row. A case where the bank 121 is formed on the upper part of the source wiring was explained here, but it may also be provided on the upper part of the gate wiring. In this case, a row composed of a plurality of pixels lined up in series along the gate wiring is called a pixel row.

Accordingly, the pixel portion 111 can be viewed as an assembly of a plurality of pixel rows divided by the stripe shape bank provided on the upper part of the plurality of source wirings or gate wirings. When the pixel portion is viewed as such, it can also be said that the pixel portion 111 is made up of a pixel row in which a stripe shape light emitting layer luminescing red is formed, a pixel row in which a stripe shape light emitting layer luminescing green is formed, and a pixel row in which a stripe shape light emitting layer luminescing blue is formed.

Further, since the above-stated stripe shape bank is provided on the upper part of the plurality of source wirings or plurality of gate wirings, substantially, the pixel portion 111 can also be viewed as an assembly of a plurality of pixel rows partitioned by the source wirings or the gate wirings.

Next, shown in FIG. 1B is the state of a head portion (may also be referred as a discharge portion) of the thin film deposition apparatus when the application process illustrated in FIG. 1A is performed.

Reference numeral 115 denotes a head portion of the thin film deposition apparatus with a nozzle 116a for the red color, a nozzle 116b for the green color, and a nozzle 116c for the blue color attached thereto. Furthermore, the red light emitting layer application liquid 114a, the green light emitting layer application liquid 114b, and the blue light emitting layer application liquid 114c are stored inside the respective nozzles. A pipe 117 filled up with inert gas is pressurized to thereby discharge these application liquids to the pixel portion 111. The head portion 115 is scanned in a perpendicular direction along a defined space toward the front of the drawing thereby performing the application process illustrated in FIG. 1A.

Note that the head portion is stated as being scanned throughout the present specification. In practice, the substrate is moved in a vertical or horizontal direction by the X-Y stage. Thus, the head portion is relatively scanned in a vertical or horizontal direction on the substrate. Of course, the substrate can be fixed so that the head portion itself conducts the scanning. From the viewpoint of stability, however, a method of moving the substrate is preferred.

FIG. 1C is a diagram showing an enlarged view of the vicinity of the discharge portion denoted by the reference numeral 118. The pixel portion 111 formed on the substrate 110 is an assembly of a plurality of pixels composed of a plurality of TFTs 119a to 119c and a plurality of pixel electrodes 120a to 120c. In FIG. 1B, when the nozzles 116a to 116c are pressurized by inert gas, application liquids 114a to 114c will be discharged from the nozzles 116a to 116c due to this pressure.

Note that the bank 121 formed of a resin material is provided in the space between pixels to prevent the application liquid from mixing into a space between pixels. In this structure, the width of the bank 121 (determined by the resolution of photolithography) is made narrow so that the integration degree of the pixel portion is increased, and therefore, high definition images can be attained. In particular, it is effective in the case in which the viscosity of the application liquids is 1 to 30 cp.

However, if the viscosity of the application liquid is 30 cp or more, or if the application liquid is in the form of sol or gel, then it is possible to omit the bank from the structure. In other words, as long as the angle of contact between the application liquid after it has been applied and the application surface is large enough, the application liquid will not spread out more than necessary. Therefore, the provision of the bank for preventing the application liquid from spreading out more than necessary is not required. In this case, the final shape of the light emitting layers will be formed into an oval shape (a long and narrow ellipse wherein the ratio of the major axis and the minor axis is 2 or greater), typically a long and narrow ellipse extending from one end of the pixel portion to the other end thereof.

As resin materials for forming the bank 121, acrylic. polyimide, polyamide, and polyime amide can be used. If carbon or black pigment or the like is provided in these resin materials in advance to make the resin materials black, then it is possible to use the bank 121 as a light shielding film between pixels.

In addition, by attaching a sensor that employs a light reflector near the tip of any one of the nozzles 116a, 116b, and 116c, the distance between the application surface and the nozzles may be regulated so as to maintain a fixed distance at all times. Furthermore, provision of a mechanism for regulating the gap among the nozzles 116a to 116c in correspondence with the pixel pitch (distance between pixels) allows the nozzles to be applied to EL display devices having any pixel pitch.

Thus, the application liquids 114a to 114c discharged from the nozzles 116a to 116c are applied so as to cover the respective pixel electrodes 120a to 120c. After applying the application liquids 114a to 114c, heat treatment (bake treatment or burning treatment) is carried out in vacuum to volatilize the organic solvent contained in the application liquids 114a to 114c, thereby forming the light emitting layers made of an organic EL material. Therefore, an organic solvent that will volatilize under a temperature lower than the glass transition temperature (Tg) of the organic EL material is used. Further, the film thickness of the light emitting layers that are finally formed is determined by the viscosity of the organic EL material. In this case, although the viscosity may be regulated by the choice of the organic solvent or a dopant, it is preferable that the viscosity is between 1 and 50 cp (preferably between 5 and 20 cp).

If there are many impurities likely to become crystal nuclei in the organic EL material, the possibility of crystallizing the organic EL material becomes high when the organic solvent is volatilized. When the organic EL material is crystallized, the efficiency of light emission drops, and therefore is unfavorable. It is desirable that as much as possible, impurities are not contained in the organic EL material.

To reduce the impurities, the solvent and the organic EL material are intensively refined, and it is important to keep the environment as clean as possible when mixing the solvent and the organic EL material. For the refinement of the solvent or the organic EL material, it is preferable that techniques such as evaporation, sublimation, filtration, recrystallization, re-sedimentation, chromatography, or dialyzation be performed repetitiously. It is desirable to ultimately reduce impurities such as a metal element and an alkaline metal element to 0.1 ppm or less (preferably 0.01 ppm or less)

In addition, it is preferable that sufficient attention is paid to the atmosphere in applying the application liquid containing an organic EL material formed by the thin film deposition apparatus illustrated in FIG. 1. To be more specific, it is desirable that the film deposition of the above-mentioned organic EL material is performed in a clean booth filled with inert gas such as nitrogen and inside a glove box.

Accordingly, with the employment of the thin film deposition apparatus, the three types of light emitting layers luminescing red, green, and blue can be formed at the same time. Consequently, light-emitting layers made of a high molecular organic EL material can be formed at a high throughput. In addition, different from the ink-jet method, the method of the present invention is capable of applying the application liquids in stripe shape to a pixel row without any intervals, resulting in an extremely high throughput.

BRIEF DESCRIPTION OF THE DRAWINGS

In the accompanying drawings:

FIG. 2 is a diagram showing the cross-sectional structure of a pixel portion;

FIGS. 11A and 11B are diagrams showing the top structure and the cross-sectional structure, respectively, of an active matrix EL display device;

DETAILED DESCRIPTION OF THE PREFERRED EMBODIMENTS

Embodiment Mode

Figure 3A:
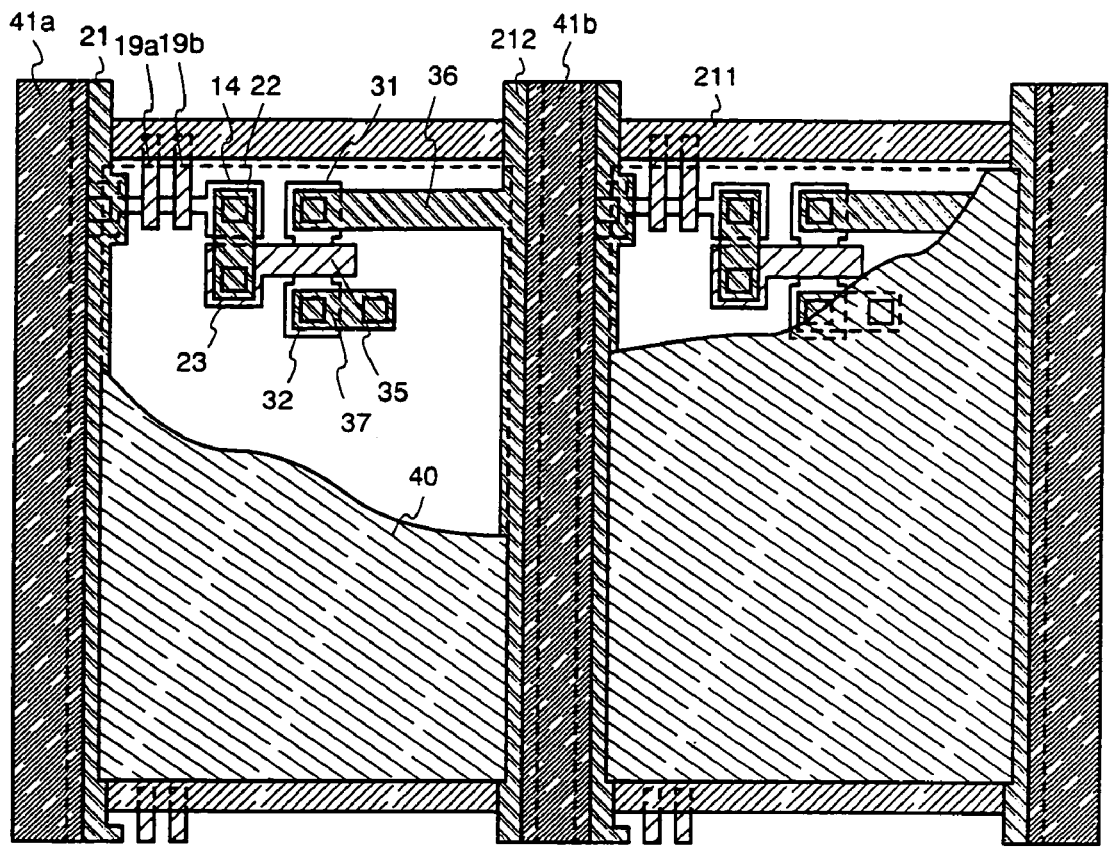
FIGS. 3A and 3B are diagrams showing the top structure and the configuration, respectively, of the pixel portion.
Figure 3B:
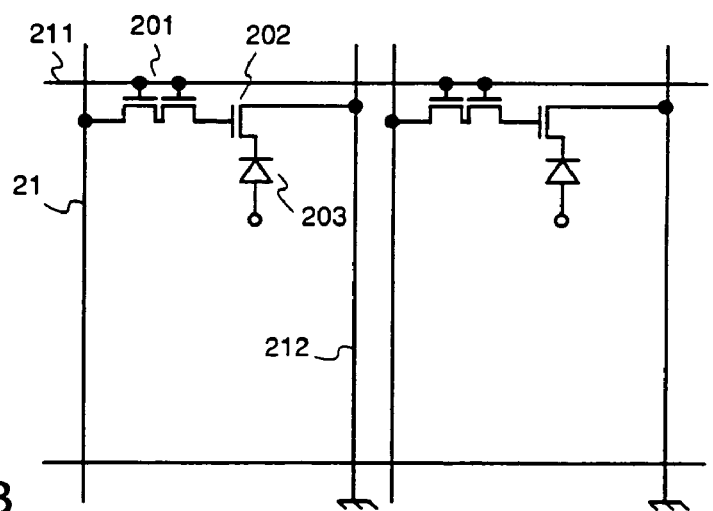

Some embodiments of the present invention will be described with reference to FIGS. 2, 3A and 3B. FIG. 2 shows a cross-sectional view of a pixel portion in an EL display device in accordance with the present invention. FIG. 3A shows a top view of the pixel portion, and FIG. 3B shows the circuit configuration thereof. In an actual structure, pixels are arranged in a plurality of lines to be in matrix, thereby forming a pixel portion (image display portion). FIG. 2 illustrates a cross-sectional view taken along the line A-A' in FIG. 3A. Accordingly, the same components are commonly designated by the same reference numerals in both of the figures, and it will be advantageous for understanding the structure to make reference to both of the figures. In addition, the two pixels illustrated in the top view of FIG. 3A have the same structure.

In FIG. 2, reference numeral 11 denotes a substrate, and 12 denotes a base insulating film (hereinafter referred to as the base film). As the substrate 11, a glass substrate, a glass ceramic substrate, a quartz substrate, a silicon substrate, a ceramic substrate, a metal substrate, or a plastic substrate (including a plastic film) can be used.

In addition, the base film 12 is especially advantageous for a substrate including mobile ions or a substrate having conductivity, but does not necessarily have to be provided for a quartz substrate. As the base film 12, an insulating film containing silicon may be used. In the present specification, the "insulating film containing silicon" refers to an insulating film containing silicon and oxygen or nitrogen at a predetermined ratio, and more specifically, a silicon oxide film, a silicon nitride film, or a silicon oxide nitride film (represented as $SiO_xN_y$.)

It is advantageous to provide the base film 12 with a heat radiation function to dissipate heat generated in a TFT in order to prevent a TFT or an EL element from deteriorating. The heat radiation function can be provided by any known material.

In this example, two TFTs are provided in one pixel. A TFT 201 functions as a switching element (hereinafter referred to as the switching TFT), and a TFT 202 functions as a current controlling element for controlling an amount of current to flow through the EL element (hereinafter referred to as the current control TFT.) Both of the TFTs 201 and 202 are made of the n-channel TFT.

Since the n-channel TFT has a field effect mobility higher than that of the p-channel TFT, the n-channel TFT can operate at higher speed and accept a large amount of current. Furthermore, a current of the same amount can flow through the n-channel TFT of smaller size as compared to the p-channel TFT. Accordingly, it is preferable to use the n-channel TFT as the current control TFT since this results in an increased effective luminescence surface area of the display portion.

The p-channel TFT has advantages, e.g., in which the injection of hot carriers becomes hardly a problem and an OFF current value is small. Thus, it has been already reported the structures in which the p-channel TFT is used as the switching TFT or the current control TFT. However, in the present invention, the disadvantages in connection with the injection of hot carriers and a small OFF current value can be overcome even in the n-channel TFT by providing the arrangement of LDD regions. Thus, it is also possible that all of the TFTs in the pixel are made of the n-channel TFTs.

However, the present invention is not limited to the case where the switching TFT and the current control TFT are made of the n-channel TFTs. It is possible to use the p-channel TFT as both or either of the switching TFT and the current control TFT.

The switching TFT 201 is formed to have a source region 13, a drain region 14, an active layer including LDD regions 15a to 15d, a high concentration impurity region 16 and channel forming regions 17a and 17b, a gate insulating film 18, gate electrodes 19a and 19b, a first interlayer insulating film 20, a source wiring 21, and a drain wiring 22.

In addition, as shown in FIGS. 3A and 3B, the gate electrodes 19a and 19b are electrically connected to each other by means of a gate wiring 211 which is made of a different material (that has a lower resistivity than the gate electrodes 19a and 19b), thereby forming a double-gate structure. It is of course possible to employ, not only the double-gate structure, but also the so-called multi-gate structure (a structure including an active layer, which contains two or more channel forming regions, connected in series) such as a triple-gate structure.

The multi-gate structure is significantly advantageous for decreasing OFF current value. In accordance with the present invention, a switching element having a low OFF current value can be realized by providing the switching element 201 in the pixel with the multi-gate structure.

In addition, the active layer is formed of a semiconductor film that includes a crystalline structure. This may be a single crystalline semiconductor film, a polycrystalline semiconductor film, or a microcrystalline semiconductor film. The gate insulating film 18 may be formed of an insulating film containing silicon. Furthermore, any kind of conductive films can be used as the gate electrode, the source wiring, or the drain wiring.

Furthermore, in the switching TFT 201, the LDD regions 15a to 15d are disposed so as not overlap the gate electrodes 19a and 19b. Such a structure is significantly advantageous for reducing an OFF current value.

For reducing the OFF current value, it is further preferable to provide an offset region (which is made of a semiconductor layer having the same composition as the channel forming regions and that a gate voltage is not applied thereto) between the channel forming regions and the LDD regions. In addition, in the case of the multi-gate structure having two or more gate electrodes, the high concentration impurity region disposed between the channel forming regions is effective for reducing the OFF current value.

As mentioned above, the OFF current value can be sufficiently lowered if the multi-gate structure TFT is used as the switching TFT 201 of the pixel. In other words, a low OFF current value means that the voltage applied to the gate of the current control TFT can be maintained longer. Therefore, a capacitor for holding an electric potential, such as the one of FIG. 2 disclosed in Japanese Patent Application Laid-open No. Hei 10-189252, can be made smaller, and even if omitted, an advantage of capable of maintaining the gate voltage of the current control TFT until the next writing period can be attained.

Then, the current control TFT 202 is formed to have a source region 31, a drain region 32, an active layer including an LDD region 33 and a channel forming region 34, a gate insulating film 18, a gate electrode 35, a first interlayer insulating film 20, a source wiring 36, and a drain wiring 37. Although the illustrated gate electrode 35 has the single-gate structure, it may have the multi-gate structure.

As shown in FIG. 2, a drain of the switching TFT 201 is connected to a gate of the current control TFT 202. More specifically, the gate electrode 35 of the current control TFT 202 is electrically connected to the drain region 14 of the switching TFT 201 through the drain wiring 22. Furthermore, the source wiring 36 is connected to a power supply line 212 (see FIG. 3A).

The current control TFT 202 is a device intended to control an amount of current to be injected into the EL element 203. However, considering possible deterioration of the EL element, it is not preferable to allow a large amount of current to flow. Accordingly, in order to prevent excessive current from flowing through the current control TFT 202, the channel length (L) thereof is preferably designed to be long. Desirably, the channel length (L) is designed to be 0.5 to 2 μm (preferably, 1 to 1.5 μm) long per pixel.

Figure 9:
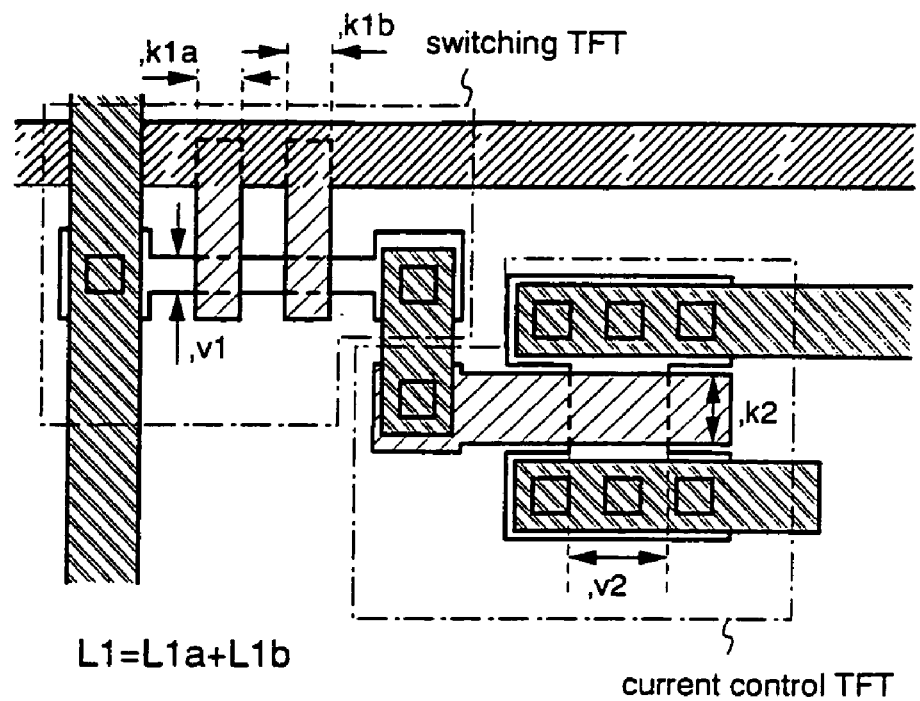
FIG. 9 is an enlarged diagram of the pixel portion.

In view of the above-mentioned description, as shown in FIG. 9, the channel length L1 (where L1=L1a+L1b) and the channel width W1 of the switching TFT, and the channel length L2 and the channel width W2 of the current control TFT are preferably set as follows: W1 is in the range from 0.1 to 5 μm (typically, 0.5 to 2 μm); W2 is in the range from 0.5 to 10 μm (typically, 2 to 5 μm); L1 is in the range from 0.2 to 18 μm (typically, 2 to 15 μm); and L2 is in the range from 1 to 50 μm (typically, 10 to 30 μm). However, the present invention is not limited to the above-mentioned values.

The length (width) of the LDD regions to be formed in the switching TFT 201 is set in the range from 0.5 to 3.5 μm, typically in the range from 2.0 to 2.5 μm.

The EL display device as shown in FIG. 2 has features in which the LDD region 33 is provided between the drain region 32 and the channel forming region 34 in the current control TFT 202, and part of the LDD region 33 overlaps the gate electrode 35 through the gate insulating film 18.

In order for the current control TFT 202 to supply a current for making the EL element 204 luminesce, it is preferable that steps are taken against deterioration due to hot carrier injection as shown in FIG. 2.

Note that in order to suppress the value of the off current, it is effective to form the LDD region so that it overlaps a portion of the gate electrode. In this case, the region that overlaps the gate electrode suppresses hot carrier injection, and the region that does not overlap the gate electrode prevents OFF current value.

The length of the LDD region, which overlaps the gate electrode, may be made from 0.1 to 3 μm (preferably between 0.3 and 1.5 μm) at this point. Further, in the case of providing an LDD region that does not overlap the gate electrode, the length of the LDD region may be made from 1.0 to 3.5 μm (preferably between 1.5 and 2.0 μm).

It is also possible to use a parasitic capacitance (also referred to as a gate capacitance), which is formed in the region between the gate electrode and the LDD region that overlaps the gate electrode via the gate insulating film, as a capacitor for actively maintaining electric potential (maintaining an electric charge). In the present embodiment, the LDD region 33 shown in FIG. 2 is formed to thereby form a gate capacitance between the gate electrode 35 and the LDD region 33. This gate capacitance is used as a capacitor for maintaining electric potential, such as the one shown in FIG. 2, disclosed in Japanese Patent Application Laid-open No. Hei 10-189252.

Of course, it does not matter if a special capacitor is formed. However, by forming the capacitor with a structure such as the present embodiment, it is possible to form the capacitor for maintaining electric potential on an extremely small area, and it becomes possible to increase the effective luminescence surface area of the pixel (surface area that can extract light emitted from the EL element).

The carrier (electrons in this case) flow direction is always the same for the current control TFT 202, and therefore it is sufficient to form the LDD region on only the drain region side as measures against hot carriers.

From the view point of increasing a possible amount of current to flow, it is also effective to increase film thickness of the active layer (in particular, a thickness at the channel forming region) of the current control TFT 202 (preferably in the range from 50 to 100 nm, and more preferably in the range from 60 to 80 nm). On the other hand, in the case of the switching TFT 201, from the view point of reducing an OFF current value, it is also effective to decrease film thickness of the active layer (in particular, a thickness at the channel forming region) of the current control TFT 202 (preferably in the range from 20 to 50 nm, and more preferably in the range from 25 to 40 nm.)

Further, in the present embodiment, the current control TFT 202 is shown as a single-gate structure. However, it may also be a multi-gate structure composed of a plurality of TFTs connected in series. Furthermore, the current control TFT may also be a structure in which the plurality of TFTs is connected in rows (parallel) to substantially divide the channel forming region into a plural number of regions, thereby performing highly effective heat radiation. Such structure is effective as a measure against deterioration due to heat.

Next, reference numeral 38 denotes a first passivation film, and its film thickness may be formed to between 10 nm to 1 μm (preferably between 200 and 500 nm). An insulating film containing silicon (particularly a silicon oxide nitride film or a silicon nitride film is preferred) can be employed as a material for this film. Furthermore, it is effective to form the first passivation film 38 to have a high thermal radiation effect.

A second interlayer insulating film 39 (a leveling film) formed on the first passivation film 38 performs the leveling of a stepped portion that are formed by the TFT. An organic resin film is preferable as the second interlayer insulating film 39, and one such as polyimide, polyamide, acrylic, or BCB (benzocyclobutane) may be used. An inorganic film may, of course, also be used, provided that sufficient leveling is possible.

The leveling of a stepped portion in the TFT by the second interlayer insulating film 39 is extremely important. The EL layer formed afterward is very thin, and therefore there are cases in which poor luminescence is caused by the existence of a stepped portion. It is therefore preferable to perform leveling before forming a pixel electrode so as to be able to form the EL layer on as level a surface as possible.

Reference numeral 40 denotes a pixel electrode (EL element cathode) made from a highly reflective conductive film. After opening a contact hole (an opening) in the second interlayer insulating film 39 and in the first passivation film 38, the pixel electrode 40 is formed so as to be connected to the drain wiring 37 of the current control TFT 202 in the formed opening portion. It is preferable to use low resistant conductive films such as aluminum alloy and copper alloy as the pixel electrode 40. Of course, it may also be a laminate structure with other conductive films.

Figure 1A:
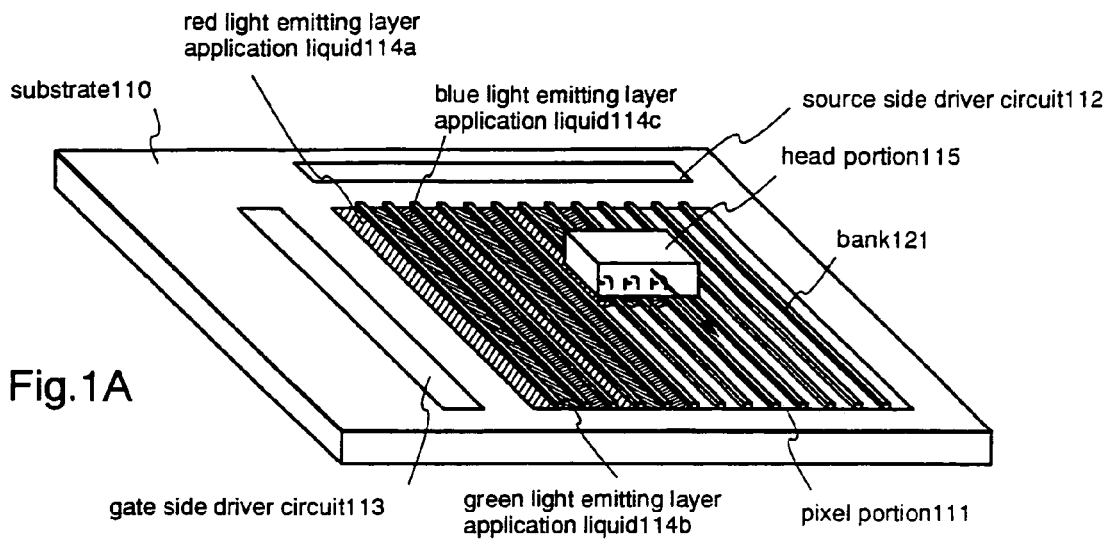
FIGS. 1A to 1C are diagrams showing an application process of an organic EL material of the present invention.
Figure 1B:
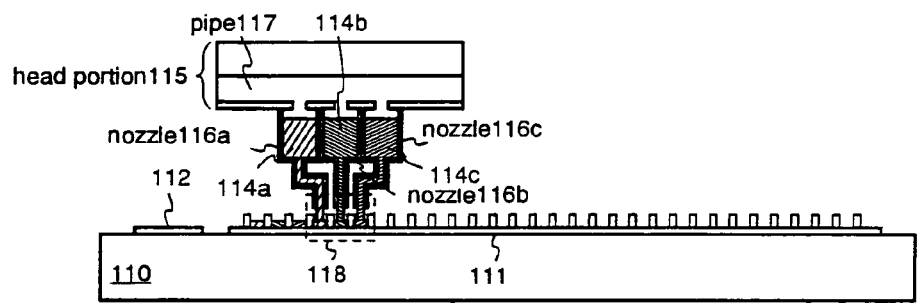
Figure 1C:
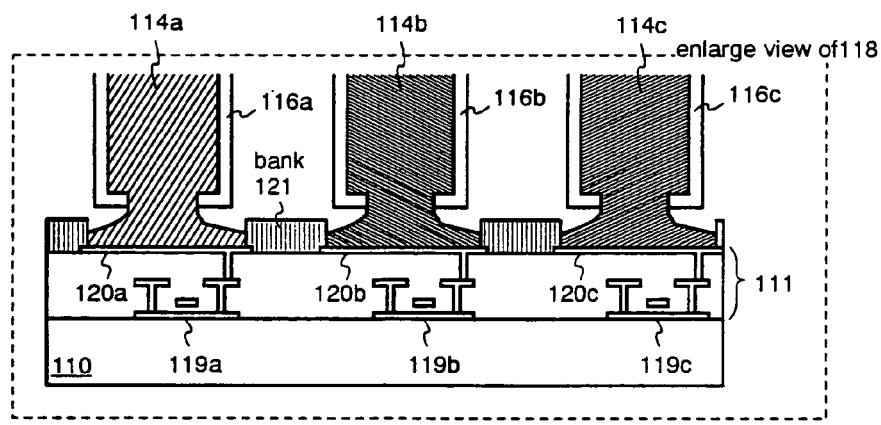

A light emitting layer 42 is formed by a device such as the thin film deposition apparatus explained in FIG. 1. It is to be noted that although only one pixel is illustrated in the drawing, light emitting layers corresponding to the respective colors R (red), G (green), and B (blue) are simultaneously formed. A high molecular material is used for the organic EL material as the light-emitting layer. Polymers such as the following can be given as typical high molecular materials: polyparaphenylene vinylene (PPV)-based material; polyvinyl carbazole (PVK)-based one; and polyfluorenes-based one.

Note that there are various types of PPV-based organic EL material. A molecular formula such as the following has been reported.

(H. Shenk, H. Becker, O. Gelsen, E. Kluge, W. Kreuder and H. Spreitzer, "Polymers for Light Emitting Diodes", Euro Display, Proceedings, 1999, pp. 33-37)

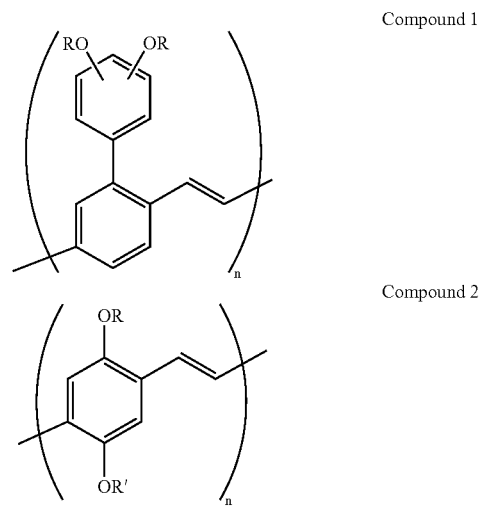

Compound 1

Compound 2

Further, the molecular formula of polyphenylene vinylene disclosed in Japanese Patent Application Laid-open No. 10-92576 can be used. The molecular formula becomes as follows:

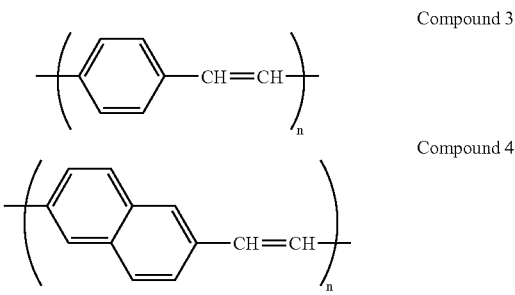

Compound 3

Compound 4

Further, as a molecular formula of a PVK-based organic EL material, there is one such as the following.

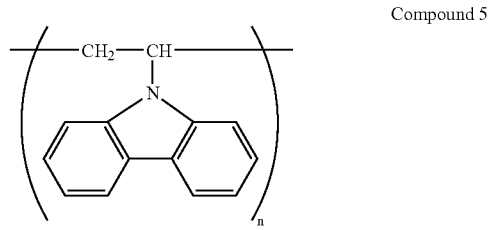

Compound 5

The application of the high molecular organic EL material can be performed by dissolving the high molecular organic EL material in a solvent when it is in a polymer state, or dissolving the high molecular organic EL material in a solvent when it is in a monomer state and then performing polymerization. In the case of applying it in the monomer state, first, a polymer precursor is formed and then heat treatment is performed in vacuum to thereby polymerize it into a polymer.

As a concrete light emitting layer, a cyano-paraphenylene vinylene may be used for the light emitting layer luminescing a red color; a paraphenylene vinylene for the light emitting layer luminescing a green color; and a polyphenylene vinylene or a polyalkylphenylene for the light emitting layer luminescing a blue color. The film thickness of the light emitting layers may be formed to between 30 and 150 nm (preferably between 40 and 100 nm).

Further, a fluorescent substance (typically coumarin 6, rublene, Nile Red, DCM, quinacridon, etc.) is doped into the light emitting layer to transfer the fluorescent substance to the center of luminescence, and therefore, a desired luminescence may be obtained. Any known fluorescent substance may be used.

However, the above examples are only some examples of organic EL materials which can be used as the light emitting layer of the present invention, and there is absolutely no need to limit the EL material to these. In the present invention, a mixture of an organic EL material and a solvent is applied by using the method illustrated in FIG. 1. The solvent is then volatilized, thereby removing the solvent to form a light-emitting layer. Therefore, during the volatilization of the solvent, the combinations of any type of organic EL materials that do not exceed the glass transition temperature of the light emitting layer may be used.

Chloroform, dichloromethane, γ butyl lactone, butyl cellosolve, or NMP (N-methyl-2-pyrrolidone) are cited as typical solvents. It is also effective to add a dopant for raising the viscosity of the application liquid.

Furthermore, when forming the light-emitting layer 42, the treatment atmosphere is a dry atmosphere with as small amount of moisture as possible, desirably, carrying out the formation in an inert gas atmosphere. Degradation of the EL layer is easily caused by the presence of moisture and oxygen. Therefore, when forming the EL layer, it is necessary to eliminate these factors as much as possible. For instance, preferably in atmospheres such as a dry nitrogen atmosphere and a dry argon atmosphere. In order to do this, the thin film deposition apparatus of FIG. 1 is installed in a clean booth that is filled with inert gas. It is desirable that the film deposition process of the light emitting layer be carried out in this atmosphere.

If the light emitting layer 42 is formed in the above-mentioned manner, a hole injection layer 43 will be formed next. The present embodiment mode uses polythiophene (PEDOT) or polyaniline (PAni) as the hole injection layer 43. Since these materials are water-soluble, the light emitting layer 42 can be formed without dissolving, and its film thickness may be 5 to 30 nm (preferably 10 to 20 nm)

An anode 44 made from a transparent conductive film is provided on the hole injection layer 43. In the case of the present embodiment mode, light produced by the light emitting layer 42 is emitted towards the upper side surface (in a direction towards the top of the TFT). Thus, the anode must have light transmitting characteristics. A compound of indium oxide and tin oxide and a compound of indium oxide and zinc oxide can be used as the transparent conductive film. However, because the transparent conductive film is formed after the formation of the light emitting layer and the hole injection layer, which are low in heat resistance, materials which can be formed into films at as low a temperature as possible are preferable.

The EL element 203 is completed at the point the anode 44 is formed. Note that the EL element 203 referred to here designates a capacitor formed of the pixel electrode (cathode) 40, the hole injection layer 43, the light emitting layer 42, and the anode 44. As shown in FIG. 3, since the pixel electrode 40 almost coincides with the surface area of the pixel, the entire pixel functions as the EL element. Accordingly, the utility efficiency of luminescence is extremely high, making it possible to display brighter images.

Further, in the present embodiment mode, the pixel electrode 40 is formed so that its structure is that of a cathode. Therefore, lights generated by the light emitting layer are all emitted to the anode side. However, contrary to the structure of this EL element, it is also possible to form the pixel electrode so that its structure is that of an anode made of a transparent conductive film. In this case, since lights generated by the light emitting layer are also emitted to the anode side, light is observed from the substrate 11 side.

In the present embodiment mode, a second passivation film 45 is further provided on the anode 44. As the second passivation film 45, a silicon nitride film or a silicon oxide nitride film is preferable. The purpose of this is to shield the EL element from the outside, and has two meanings of which one is to prevent the organic EL material from deterioration due to oxidation, and the other is to suppress the leakage of gas from the organic EL material. Hence, the reliability of the EL display device can be increased.

The EL display device of the present invention has a pixel portion containing a pixel with a structure as shown in FIG. 2, and TFTs having different structures in response to their functions are arranged in the pixel. A switching TFT having a sufficiently low OFF current value, and a current control TFT which is strong with respect to hot carrier injection can be formed within the same pixel, and an EL display device having high reliability and which is capable of good image display (high operating performance) can thus be formed.

It is to be noted that although the structure of a planar TFT was shown in the present embodiment mode as an example using a top gate TFT, a bottom gate TFT (typically a reverse stagger TFT) may also be used. The present invention is characterized by the film deposition method of the organic EL element, and the structure of the TFT to be arranged in the pixel is not limited.

Embodiment 1

The embodiments of the present invention are explained using FIGS. 4A to 6C. A method of simultaneous manufacture of a pixel portion, and TFTs of a driver circuit portion formed in the periphery of the pixel portion, is explained here. Note that in order to simplify the explanation, a CMOS circuit is shown as a basic circuit for the driver circuits.

Figure 4A:
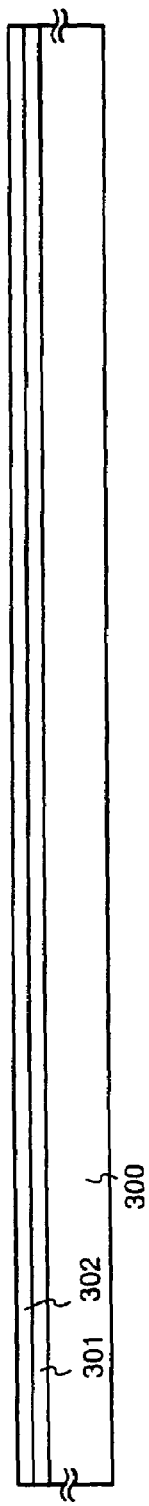
FIGS. 4A to 4E are diagrams showing manufacturing processes of an EL display device.

First, as shown in FIG. 4A, a base film 301 is formed to a thickness of 300 nm on a glass substrate 300. Silicon oxide nitride films are laminated as the base film 301 in Embodiment 1. At this point, it is appropriate to set the nitrogen concentration to between 10 and 25 wt % in the film contacting the glass substrate 300. In addition, it is effective that the base film 301 has a thermal radiation effect, and a DLC (diamond-like carbon) film may also be provided.

Next, an amorphous silicon film (not shown in the figures) is formed with a thickness of 50 nm on the base film 301 by a known deposition method. Note that it is not necessary to limit this to the amorphous silicon film, and another film may be formed provided that it is a semiconductor film containing an amorphous structure (including a microcrystalline semiconductor film). In addition, a compound semiconductor film containing an amorphous structure, such as an amorphous silicon germanium film, may also be used. Further, the film thickness may be made from 20 to 100 nm.

The amorphous silicon film is then crystallized by a known technique, forming a crystalline silicon film (also referred to as a polycrystalline silicon film or a polysilicon film) 302. Thermal crystallization using an electric furnace, laser annealing crystallization using a laser light, and lamp annealing crystallization using an infrared lamp exist as known crystallization methods. Crystallization is performed in Embodiment 1 using an excimer laser light, which uses XeCl gas.

Note that pulse emission excimer laser light formed into a linear shape is used in Embodiment 1, but a rectangular shape may also be used, and continuous emission argon laser light and continuous emission excimer laser light can also be used.

In this embodiment, although the crystalline silicon film is used as the active layer of the TFT, it is also possible to use an amorphous silicon film.

Note that it is effective to form the active layer of the switching TFT, in which there is a necessity to reduce the off current, by the amorphous silicon film, and to form the active layer of the current control TFT by the crystalline silicon film. Electric current flows with difficulty in the amorphous silicon film because the carrier mobility is low, and the off current does not easily flow. In other words, the most can be made of the advantages of both the amorphous silicon film, through which current does not flow easily, and the crystalline silicon film, through which current easily flows.

Figure 4B:
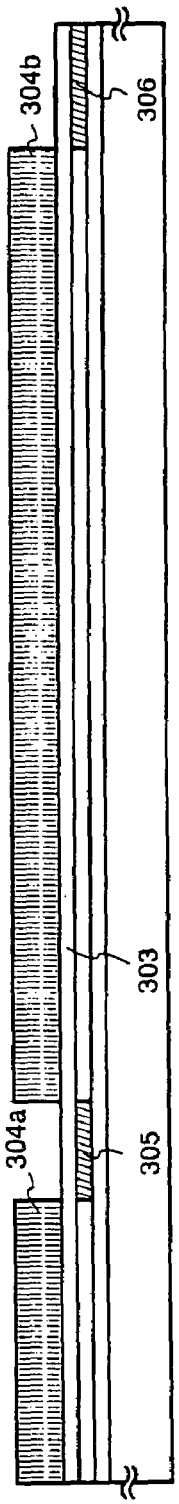

Next, as shown in FIG. 4B, a protective film 303 is formed on the crystalline silicon film 302 with a silicon oxide film having a thickness of 130 nm. This thickness may be chosen within the range of 100 to 200 nm (preferably between 130 and 170 nm). Furthermore, other films may also be used providing that they are insulating films containing silicon. The protective film 303 is formed so that the crystalline silicon film is not directly exposed to plasma during addition of an impurity, and so that it is possible to have delicate concentration control of the impurity.

Resist masks 304a and 304b are then formed on the protective film 303, and an impurity element, which imparts n-type conductivity (hereafter referred to as an n-type impurity element), is added. Note that elements residing in periodic table group 15 are generally used as the n-type impurity element, and typically phosphorous or arsenic can be used. Note that a plasma doping method is used, in which phosphine ($PH_3$) is plasma activated without separation of mass, and phosphorous is added at a concentration of $1 \times 10^{18}$ atoms/$cm^3$ in Embodiment 1. An ion implantation method, in which separation of mass is performed, may also be used, of course.

The dose amount is regulated so that the n-type impurity element is contained in n-type impurity regions 305 and 306, thus formed by this process, at a concentration of $2 \times 10^{16}$ to $5 \times 10^{19}$ atoms/$cm^3$ (typically between $5 \times 10^{17}$ and $5 \times 10^{18}$ atoms/$cm^3$).

Figure 4C:

Next, as shown in FIG. 4C; the protective film 303 is removed, and an activation of the added n-type impurity elements is performed. A known technique of activation may be used as the means of activation, but activation is done in Embodiment 1 by irradiation of excimer laser light. Of course, a pulse emission excimer laser and a continuous emission excimer laser may both, be used, and it is not necessary to place any limits on the use of excimer laser light. The goal is the activation of the added impurity element, and it is preferable that irradiation is performed at an energy level at which the crystalline silicon film does not melt. Note that the laser irradiation may also be performed with the protective film 303 in place.

The activation by heat treatment (furnace annealing) may also be performed along with activation of the impurity element by laser light. When activation is performed by heat treatment, considering the heat resistance of the substrate, it is good to perform heat treatment on the order of 450 to 550° C.

A boundary portion (connecting portion) with end portions of the n-type impurity regions 305 and 306, namely regions, in which the n-type impurity element is not added, on the periphery of the n-type impurity regions 305 and 306, is delineated by this process. This means that, at the point when the TFTs are later completed, extremely good connecting portion can be formed between LDD regions and channel forming regions.

Figure 4D:
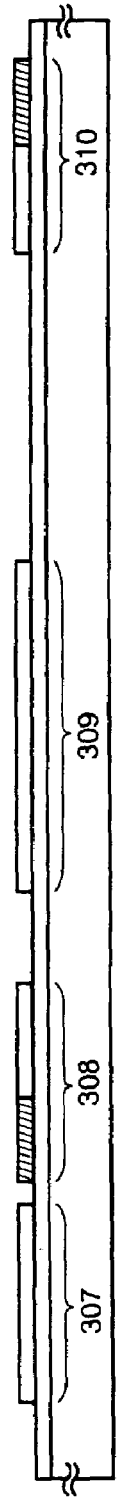

Unnecessary portions of the crystalline silicon film are removed next, as shown in FIG. 4D, and island shape semiconductor films (hereafter referred to as active layers) 307 to 310 are formed.

Figure 4E:
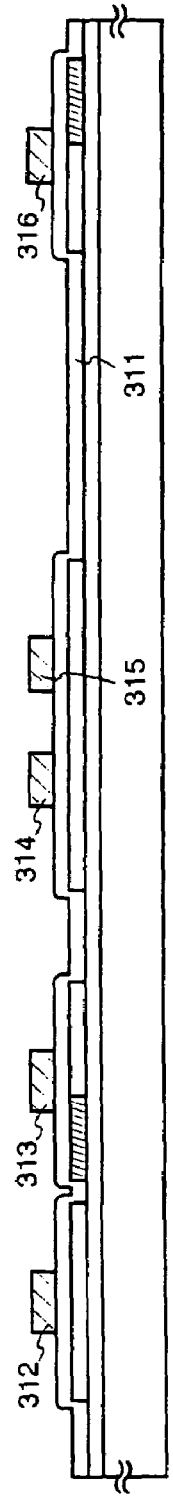

Then, as shown in FIG. 4E, a gate insulating film 311 is formed, covering the active layers 307 to 310. An insulating film containing silicon and with a thickness of 10 to 200 nm, preferably between 50 and 150 nm, may be used as the gate insulating film 311. A single layer structure or a lamination structure may be used. A 110 nm thick silicon oxide nitride film is used in Embodiment 1.

Thereafter, a conductive film having a thickness of 200 to 400 nm is formed and patterned to form gate electrodes 312 to 316. In the present embodiment, the gate electrodes and wirings (hereinafter referred to as the gate wirings) electrically connected to the gate electrodes for providing conductive paths are formed of different materials from each other. More specifically, the gate wirings are made of a material having a lower resistivity than the gate electrodes. Thus, a material enabling fine processing is used for the gate electrodes, while the gate wirings are formed of a material that can provide a smaller wiring resistance but is not suitable for fine processing. It is of course possible to form the gate electrodes and the gate wirings with the same material.

Although the gate electrode can be made of a single-layered conductive film, it is preferable to form a lamination film with two, three or more layers for the gate electrode if necessary. Any known conductive materials can be used for the gate electrode. It should be noted, however, that it is preferable to use such a material that enables fine processing, and more specifically, a material that can be patterned with a line width of 2 μm or less.

Typically, it is possible to use a film made of an element selected from tantalum (Ta), titanium (Ti), molybdenum (Mo), tungsten (W), chromium (Cr), and silicon (Si), a film of nitride of the above element (typically a tantalum nitride film, tungsten nitride film, or titanium nitride film), an alloy film of combination of the above elements (typically Mo—W alloy or Mo—Ta alloy), or a silicide film of the above element (typically a tungsten silicide film or titanium silicide film). Of course, the films may be used as a single layer or a laminate layer.

In this embodiment, a laminate film of a tungsten nitride (WN) film having a thickness of 30 nm and a tungsten (W) film having a thickness of 370 nm is used. This may be formed by sputtering. When an inert gas of Xe, Ne or the like is added as a sputtering gas, film peeling due to stress can be prevented.

The gate electrodes 313 and 316 are formed at this time so as to overlap a portion of the n-type impurity regions 305 and 306, respectively, sandwiching the gate insulating film 311. This overlapping portion later becomes an LDD region overlapping the gate electrode.

Figure 5A:
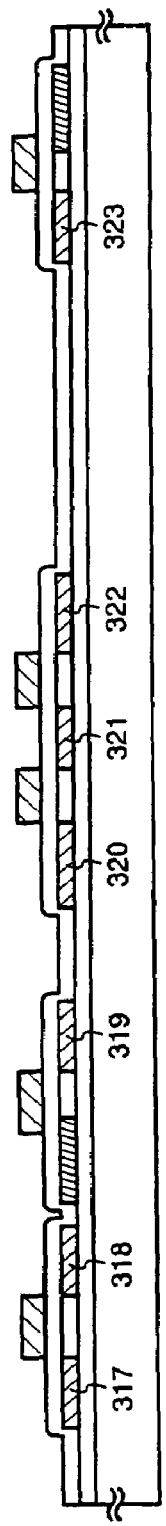
FIGS. 5A to 5D are diagrams showing manufacturing processes of an EL display device.

Next, an n-type impurity element (phosphorous is used in Embodiment 1) is added in a self-aligning manner with the gate electrodes 312 to 316 as masks, as shown in FIG. 5A. The addition is regulated so that phosphorous is added to impurity regions 317 to 323 thus formed at a concentration of 1/10 to 1/2 that of the impurity regions 305 and 306 (typically between 1/4 and 1/3). Specifically, a concentration of $1\times10^{16}$ to $5\times10^{18}$ atoms/cm$^3$ (typically $3\times10^{17}$ to $3\times10^{18}$ atoms/cm$^3$) is preferable.

Figure 5B:
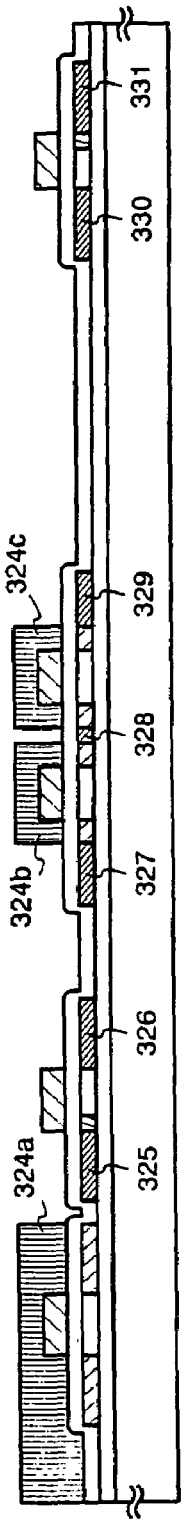

Resist masks 324a to 324c are formed next, with a shape covering the gate electrodes etc., as shown in FIG. 5B, and an n-type impurity element (phosphorous is used in Embodiment 1) is added, forming impurity regions 325 to 331 containing phosphorous at high concentration. Ion doping using phosphine (PH$_3$) is also performed here, and is regulated so that the phosphorous concentration of these regions is from $1\times10^{20}$ to $1\times10^{21}$ atoms/cm$^3$ (typically between $2\times10^{20}$ and $5\times10^{21}$ atoms/cm$^3$).

A source region or a drain region of the n-channel TFT is formed by this process, and in the switching TFT, a portion of the n-type impurity regions 320 to 322 formed by the process of FIG. 5A is remained. These remaining regions correspond to the LDD regions 15a to 15d of the switching TFT in FIG. 2.

Figure 5C:
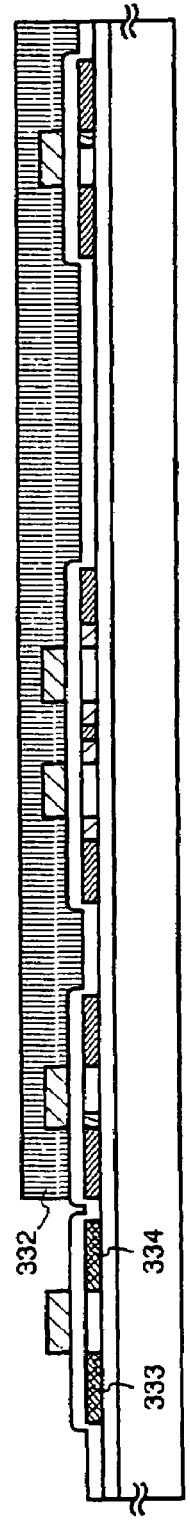
Figure 5D:
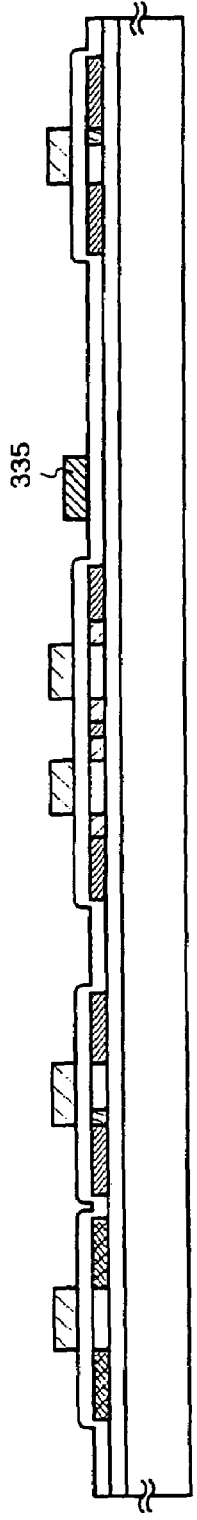

Next, as shown in FIG. 5C, the resist masks 324a to 324c are removed, and a new resist mask 332 is formed. A p-type impurity element (boron is used in Embodiment 1) is then added, forming impurity regions 333 and 334 containing boron at high concentration. Boron is added here to form impurity regions 333 and 334 at a concentration of $3\times10^{20}$ to $3\times10^{21}$ atoms/cm$^3$ (typically between $5\times10^{20}$ and $1\times10^{21}$ atoms/cm$^3$) by ion doping using diborane (B$_2$H$_6$).

Note that phosphorous has already been added to the impurity regions 333 and 334 at a concentration of $1\times10^{20}$ to $1\times10^{21}$ atoms/cm$^3$, but boron is added here at a concentration of at least 3 times that of the phosphorous. Therefore, the n-type impurity regions already formed completely invert to p-type, and function as p-type impurity regions.

Next, after removing the resist mask 332, the n-type or p-type impurity elements added to the active layer at respective concentrations are activated. Furnace annealing, laser annealing or lamp annealing can be used as a means of activation. In Embodiment 1, heat treatment is performed for 4 hours at 550° C. in a nitrogen atmosphere in an electric furnace.

At this time, it is critical to eliminate oxygen from the surrounding atmosphere as much as possible. This is because when even only a small amount of oxygen exists, an exposed surface of the gate electrode is oxidized, which results in an increased resistance and later makes it difficult to form an ohmic contact with the gate electrode. Accordingly, the oxygen concentration in the surrounding atmosphere for the activation process is set at 1 ppm or less, preferably at 0.1 ppm or less.

After the activation process is completed, the gate wiring 335 having a thickness of 300 nm is formed. As a material for the gate wiring 335, a metal film containing aluminum (Al) or copper (Cu) as its main component (occupied 50 to 100% in the composition) can be used. The gate wiring 335 is arranged, as the gate wiring 211 shown in FIG. 3A, so as to provide electrical connection for the gate electrodes 314 and 315 (corresponding to the gate electrodes 19a and 19b in FIG. 3A) of the switching TFT (see FIG. 5D).

The above-described structure can allow the wiring resistance of the gate wiring to be significantly reduced, and therefore, an image display region (pixel portion) with a large area can be formed. More specifically, the pixel structure in accordance with the present embodiment is advantageous for realizing an EL display device having a display screen with a diagonal size of 10 inches or larger (or 30 inches or larger.)

Figure 6A:
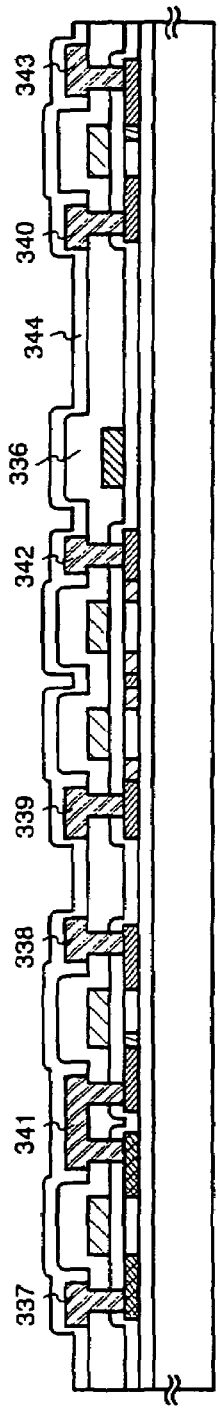
FIGS. 6A to 6C are diagrams showing manufacturing processes of an EL display device.

A first interlayer insulating film 336 is formed next, as shown in FIG. 6A. A single layer insulating film containing silicon is used as the first interlayer insulating film 336, while a lamination film may be used. Further, a film thickness of between 400 nm and 1.5 μm may be used. A lamination structure of an 800 nm thick silicon oxide film on a 200 nm thick silicon oxide nitride film is used in Embodiment 1.

In addition, heat treatment is performed for 1 to 12 hours at 300 to 450° C. in an atmosphere containing between 3 and 100% hydrogen, performing hydrogenation. This process is one of hydrogen termination of dangling bonds in the semiconductor film by hydrogen, which is thermally activated. Plasma hydrogenation (using hydrogen activated by a plasma) may also be performed as another means of hydrogenation.

Note that the hydrogenation processing may also be inserted during the formation of the first interlayer insulating film 336. Namely, hydrogen processing may be performed as above after forming the 200 nm thick silicon oxide nitride film, and then the remaining 800 nm thick silicon oxide film may be formed.

Next, a contact hole is formed in the first interlayer insulating film 336, and source wirings 337 to 340 and drain wirings 341 to 343 are formed. In this embodiment, this electrode is made of a laminate film of three-layer structure in which a titanium film having a thickness of 100 nm, an aluminum film containing titanium and having a thickness of 300 nm, and a titanium film having a thickness of 150 nm are continuously formed by a sputtering method. Of course, other conductive films may be used.

A first passivation film 344 is formed next with a thickness of 50 to 500 nm (typically between 200 and 300 nm). A 300 nm thick silicon oxide nitride film is used as the first passivation film 344 in Embodiment 1. This may also be substituted by a silicon nitride film. Note that it is effective to perform plasma processing using a gas containing hydrogen such as H$_2$ or NH$_3$ before the formation of the silicon oxide nitride film. Hydrogen activated by this preprocess is supplied to the first interlayer insulating film 336, and the film quality of the first passivation film 344 is improved by performing heat treatment. At the same time, the hydrogen added to the first interlayer insulating film 336 diffuses to the lower side, and the active layers can be hydrogenated effectively.

Figure 6B:
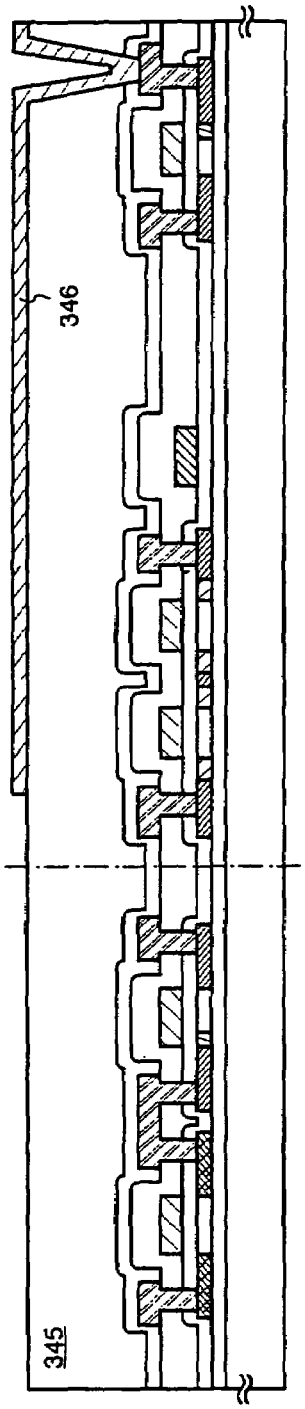

Next, as shown in FIG. 6B, a second interlayer insulating film 345 made of organic resin is formed. As the organic resin, it is possible to use polyimide, polyamide, acryl, BCB (benzocyclobutene) or the like. Especially, since the second interlayer insulating film 345 is primarily used for leveling, acryl excellent in leveling properties is preferable. In this embodiment, an acrylic film is formed to a thickness sufficient to level a stepped portion formed by TFTs. It is appropriate that the thickness is made 1 to 5 μm (more preferably, 2 to 4 μm).

Thereafter, a contact hole is formed in the second interlayer insulating film 345 and the first passivation film 344 to reach the drain wiring 343, and then the pixel electrode 346 is formed. In the present embodiment, an aluminum alloy film (an aluminum film containing titanium of 1 wt %) having a thickness of 300 nm is formed as the pixel electrode 346.

Figure 6C:
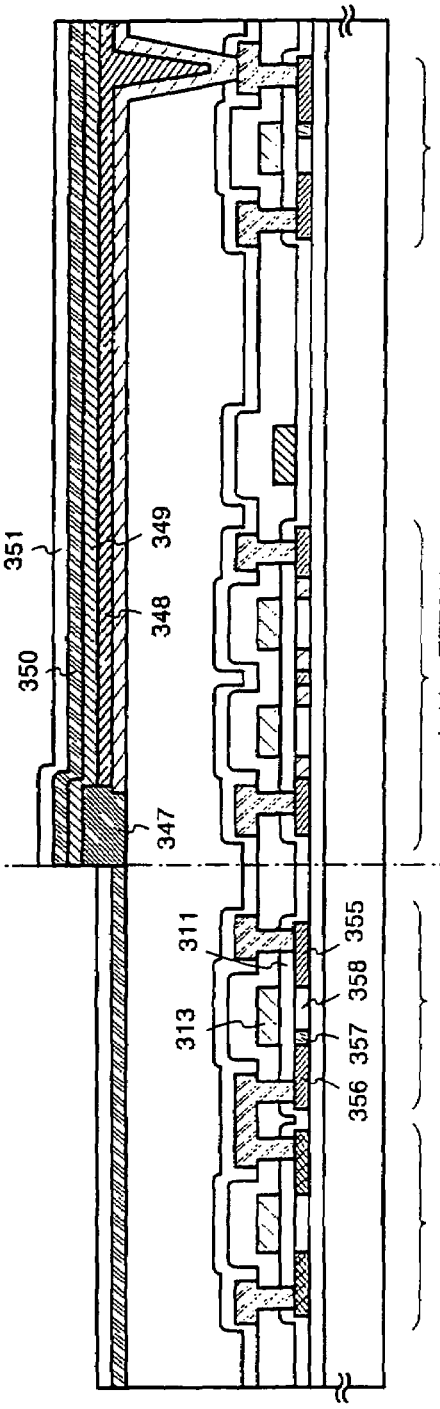

Next, as shown in FIG. 6C, a bank 347 made of resin material is formed. The bank 347 may be formed by patterning a 1 to 2 μm thick acrylic film or polyimide film. As shown in FIG. 3, the bank 347 is formed as a stripe shape between pixels. In Embodiment 1, the bank 347 is formed along the source wiring 339, but it may also be formed along the gate wiring 336.

A light emitting layer 348 is next formed by the film deposition process employing the thin film deposition apparatus explained with reference to FIG. 1. Specifically, an organic EL material that becomes the light emitting layer 348 is dissolved in a solvent such as chloroform, dichloromethane, xylene, toluene, and tetrahydrofuran, and is then applied. Thereafter, heat treatment is performed to volatilize the solvent. A film (light emitting layer) made of the organic EL material is thus formed.

It is to be noted that only one pixel is illustrated in Embodiment 1. However, a light emitting layer luminescing red color, a light emitting layer luminescing green color, and a light emitting layer luminescing blue color are all formed at the same time at this point. In Embodiment 1, a cyano-paraphenylene vinylene is used for forming the light emitting layer luminescing red color, a paraphenylene vinylene for the light emitting layer luminescing green color, and a polyalkylphenylene for the light emitting layer luminescing blue color. Each of these light emitting layers is formed to a thickness of 50 nm. In addition, 1.2 dichloromethane is used as a solvent, and then volatilized by performing heat treatment on a hot plate at 80 to 150° C. for 1 to 5 minutes.

Next, a hole injection layer 349 is formed to a thickness of 20 nm. Since the hole injection layer 349 may be provided commonly for all the pixels, it is appropriate to form the hole injection layer 349 by utilizing the spin coating method or the printing method. In Embodiment 1, polythiophene (PEDOT) is applied as a solution, and heat treatment is performed on a hot plate at 100 to 150° C. for 1 to 5 minutes to thereby volatilize its moisture. In this case, the hole injection layer 349 can be formed without dissolving the light emitting layer 348 because polyphenylene vinylene or polyalkylphenylene is insoluble.

It is to be noted that a low molecular organic EL material may be used as the hole injection layer 349. In this case, it is appropriate to form the hole injection layer by the evaporation method.

A two-layered structure made of the light emitting layer and the hole injection layer is formed in Embodiment 1. However, other layers such as a hole transporting layer, an electron injection layer, and an electron transporting layer may also be provided. Examples of various lamination structures of such combination of layers have been reported, and any structure may be used for the present invention.

After the formation of the light emitting layer 348 and the hole injection layer 349, an anode 350 made of a transparent conductive film is formed to a thickness of 120 nm. Indium oxide, which is doped with 10 to 20 wt % of zinc oxide, is used for the transparent conductive film in Embodiment 1. As the film deposition method, it is preferable to form the anode 350 by evaporation at room temperature so that the light emitting layer 348 and the hole injection layer 349 are not deteriorated.

A second passivation film 351 made of a silicon oxide nitride film is formed to a thickness of 300 nm by plasma CVD after the formation of the anode 350. At this point, it is also necessary to pay attention to the film deposition temperature. The remote plasma CVD may be employed to lower the film deposition temperature.

An active matrix substrate having a structure as shown in FIG. 6C is thus completed. Note that after the formation of the bank 347, it is effective to use the multi-chamber method (or the in-line method) of the thin film deposition apparatus for the process of forming the films until the formation of the passivation film 351, in succession and without exposure to the atmosphere.

In the active matrix substrate of the present embodiment, TFTs having optimal structures are arranged not only in the pixel portion but also in the driver circuit portion, thereby indicating an extremely high reliability and increasing its operation performance.

First, a TFT having a structure to decrease hot carrier injection so as not to drop the operation speed thereof as much as possible is used as an n-channel TFT 205 of a CMOS circuit forming a driver circuit portion. Note that the driver circuit here includes a shift register, a buffer, a level shifter, a sampling circuit (sample and hold circuit) and the like. In the case where digital driving is made, a signal conversion circuit such as a D/A converter can also be included.

In the case of Embodiment 1, as shown in FIG. 6C, an active layer of the n-channel TFT 205 is composed of a source region 355, a drain region 356, an LDD region 357, and a channel forming region 358. The LDD region 357 overlaps the gate electrode 313 via the gate insulating film 311. This structure is identical to the structure of the current control TFT 202.

Consideration not to drop the operation speed is the reason why the LDD region is formed at only the drain region side. In this n-channel TFT 205, it is not necessary to pay attention to an OFF current value very much, rather, it is better to give importance to an operation speed. Thus, it is desirable that the LDD region 357 is made to completely overlap the gate electrode to decrease a resistance component to a minimum. That is, it is preferable to remove the so-called offset.

Furthermore, deterioration of the p-channel TFT 206 in the CMOS circuit due to the injection of hot carriers is almost negligible, and thus, it is not necessary to provide any LDD region for the p-channel TFT 206. It is of course possible to provide the LDD region for the p-channel TFT 206, similarly for the n-channel TFT 205, to exhibit countermeasure against the hot carriers.

Note that, among the driver circuits, the sampling circuit is somewhat unique compared to the other circuits, in which a large electric current flows in both directions in the channel forming region. Namely, the roles of the source region and the drain region are interchanged. In addition, it is necessary to control the value of the off current to be as small as possible, and with that in mind, it is preferable to use a TFT having functions which are on an intermediate level between the switching TFT and the current control TFT in the sampling circuit.

Figure 10:
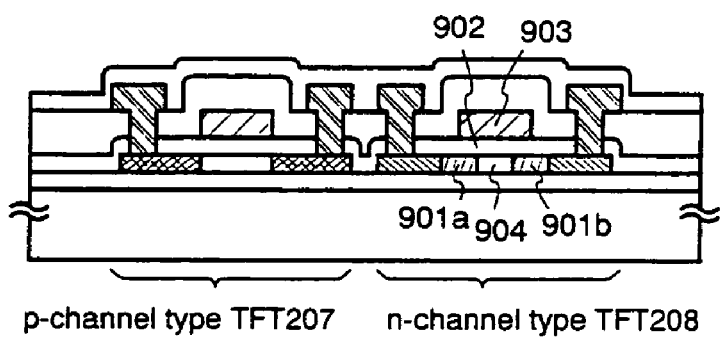
FIG. 10 is a diagram showing the element structure of a sampling circuit of an EL display device.

Accordingly, in the n-channel TFT for forming the sampling circuit, it is desirable to arrange the TFTs having the structure as shown in FIG. 10. As illustrated in FIG. 10, portions of the LDD regions 901a and 901b overlap the gate electrode 903 through the gate insulating film 902. The advantages obtainable by this structure have been already described with respect to the current control TFT 202. In the case where the TFT is used for the sampling circuit, the LDD regions are disposed to interpose the channel forming region 904 therebetween, which is different from the case of the current control TFT.

Note that, in practice, it is preferable to additionally perform packaging (sealing) after completing up through FIG. 6C by using a highly airtight protective film which has very little gas leakage (such as a laminate film or an ultraviolet cured resin film) or a sealing material that is transmissive, so that there is no exposure to the atmosphere. By making the inside of the sealing material an inert environment, and by placing a drying agent (for example, barium oxide) within the sealing material, the reliability of the EL element is increased.

Furthermore, after the airtightness is increased by the packing processing etc., a connector (a flexible printed circuit, FPC) for connecting output terminals from elements or circuits formed on the substrate and external signal terminals, is attached, completing a manufactured product. The completed manufactured product in this state of being able to be shipped is referred to as an EL display device (or an EL module) throughout this specification.

Here, the structure of the active matrix EL display device of this embodiment will be described with reference to a perspective view of FIG. 7. The active matrix EL display device of this embodiment is constituted by a pixel portion 702, a gate side driver circuit 703, and a source side driver circuit 704 formed on a glass substrate 701. A switching TFT 705 of a pixel portion is an n-channel TFT, and is disposed at an intersection point of a gate wiring 706 connected to the gate side driver circuit 703 and a source wiring 707 connected to the source side driver circuit 704. The drain of the switching TFT 705 is connected to the gate of a current control TFT 708.

In addition, the source of the current control TFT 708 is connected to a current supply line 709. A ground electric potential (earth electric potential) is imparted to the current supply line 709 in the structure such as Embodiment 1. Further, an EL element 710 is connected to the drain of the current control TFT 708. A predetermined voltage (between 3 and 12 V, preferably between 3 and 5 V) is applied to the anode of the EL element 710.

Connection wirings 712 and 713 for transmitting signals to the driver circuit portion and a connection wiring 714 connected to the current supply line 709 are provided in an FPC 711 as an external input/output terminal.

Figure 7:
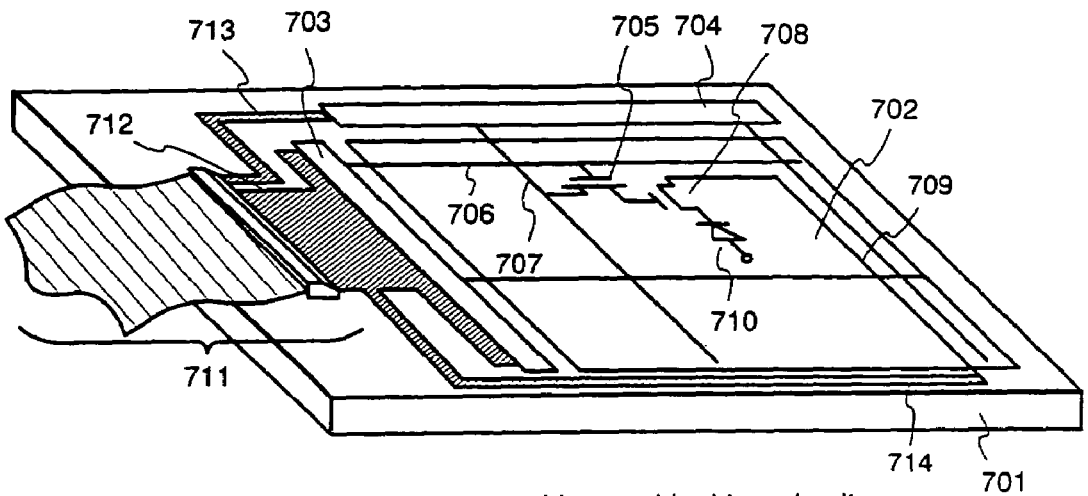
FIG. 7 is a diagram showing an external view of an EL display device.
Figure 8:
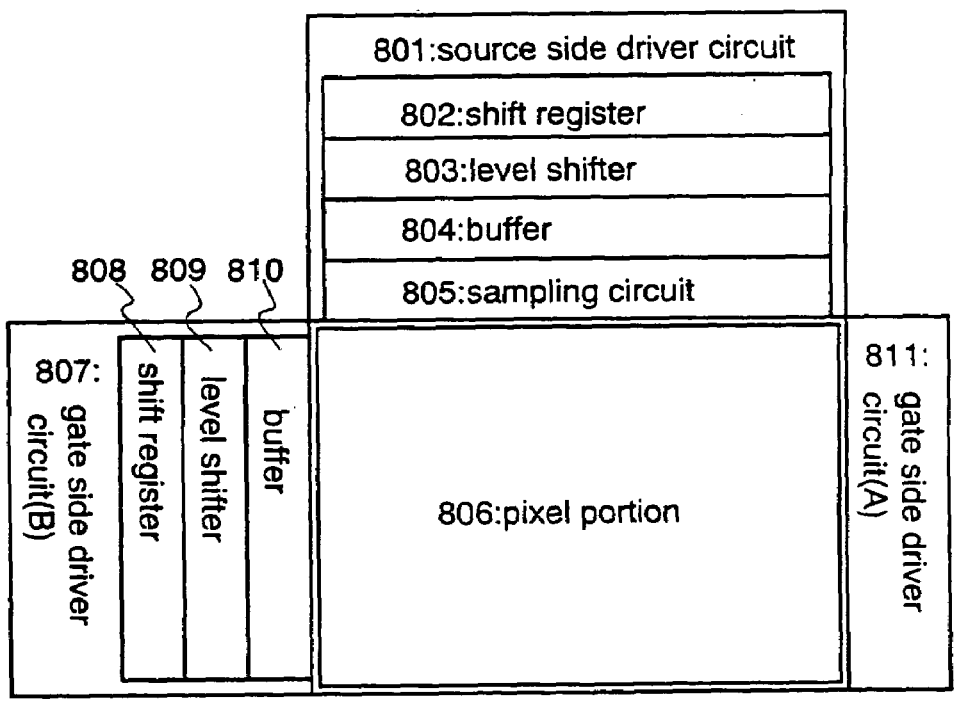
FIG. 8 is a diagram showing the circuit block structure of an EL display device.

FIG. 8 shows an example of the circuit structure of the EL display device shown in FIG. 7. The EL display device of the present embodiment is provided with a source side driver circuit 801, a gate side driver circuit (A) 807, a gate side driver circuit (B) 811 and a pixel portion 806. Note that, throughout the present specification, the driver circuit portion is the generic name for the source side driver circuit and the gate side driver circuits.

The source side driver circuit 801 is provided with a shift register 802, a level shifter 803, a buffer 804, and a sampling circuit (sample and hold circuit) 805. The gate side driver circuit (A) 807 is provided with a shift register 808, a level shifter 809, and a buffer 810. The gate side driver circuit (B) 811 also has the same structure.

Here, the shift registers 802 and 808 have driving voltages of 5 to 16 V (typically 10 V) respectively, and the structure indicated by 205 in FIG. 6C is suitable for an n-channel TFT used in a CMOS circuit forming the circuit.

Besides, for each of the level shifters 803 and 809 and the buffers 804 and 810, similarly to the shift register, the CMOS circuit including the n-channel TFT 205 of FIG. 6C is suitable. Note that it is effective to make a gate wiring a multi-gate structure such as a double gate structure or a triple gate structure in improving reliability of each circuit.

Besides, since the source region and the drain region are inverted and it is necessary to decrease an OFF current value, a CMOS circuit including the n-channel TFT 208 of FIG. 10 is suitable for the sampling circuit 805.

The pixel portion 806 is disposed with pixels having the structure shown in FIG. 2.

The foregoing structure can be easily realized by manufacturing TFTs in accordance with the manufacturing processes shown in FIGS. 4A to 6C. In this embodiment, although only the structure of the pixel portion and the driver circuit portion is shown, if the manufacturing processes of this embodiment are used, it is possible to form a logical circuit other than the driver circuit, such as a signal dividing circuit, a D/A converter circuit, an operational amplifier circuit, a γ-correction circuit, on the same substrate, and further, it is considered that a memory portion, a microprocessor, or the like can be formed.

Furthermore, an explanation of the EL module of Embodiment 1, containing the sealing material, is made using FIGS. 11A and 11B. Note that, when necessary, the symbols used in FIGS. 7 and 8 are cited.

FIG. 11A is a diagram showing the top view of a state in which the state shown in FIG. 7 is provided with a sealing structure. Indicated by dotted lines, reference numeral 702 denotes a pixel portion, 703 denotes a gate side driver circuit, and 704 denotes a source side driver circuit. The sealing structure of the present invention is a structure in which a filling material (not shown in the figure), a cover material 1101, a seal material (not shown in the figure), and a frame material 1102 is provided to the state shown in FIG. 7.

Here, the cross-sectional view taken along line A-A' of FIG. 11A is shown in FIG. 11B. It is to be noted that the same reference numerals are used for the same components in FIGS. 11A and 11B.

As shown in FIG. 11B, the pixel portion 702 and the gate side driver circuit 703 are formed on the substrate 701. The pixel portion 702 is formed of a plurality of pixels containing the current control TFT 202 and the pixel electrode 346 which is electrically connected to the current control TFT 202. Further, the gate side driver circuit 703 is formed by using a CMOS circuit that is a complementary combination of the n-channel TFT 205 and the p-channel TFF 206.

The pixel electrode 346 functions as the cathode of the EL element. In addition, the bank 347 is formed on both ends of the pixel electrode 346, and the light emitting layer 348 and the hole injection layer 349 are formed on the inner side of the bank 347. The anode 350 of the EL element and the second passivation film 351 are further formed on the top. As explained in the embodiment mode of the present invention, the EL element may of course have a reverse structure with the pixel electrode as the anode.

In the case of Embodiment 1, the anode 350 also functions as a common wiring to all the pixels, and is electrically connected to the FPC 711 through the connection wiring 712. Furthermore, all the elements contained in the pixel portion 702 and the gate side driver circuit 703 are covered by the second passivation film 351. The second passivation film 351 may be omitted, but it is preferable to provide this film to shield the respective elements from the outside.

Next, a filling material 1103 is provided so as to cover the EL element. The filling material 1103 also functions as an adhesive for gluing the cover material 1101. As the filling material 1103, PVC (polyvinyl chloride), epoxy resins, silicon resins, PVB (polyvinyl butyral) or EVA (ethylene vinyl acetate) can be used. It is preferable to place a drying agent (not shown in the figure) inside the filling material 1103 because the absorbent effect can be maintained. At this point, the drying agent may be an agent doped into the filling material, or an agent enclosed in the filling material. However, a material having transmissivity is used in the case of Embodiment 1, to thereby emit light from the side of the filling material 1103.

Further, in Embodiment 1, a glass plate, an FRP (Fiber-glass-Reinforced Plastics) plate, PVF (polyvinyl fluoride) film, a milar film, a polyester film, or an acrylic film can be used as the cover material 1101. In the case of Embodiment 1, similar to the filling material. the cover material 1101 must be made of a transmissive material. Note that it is effective to dope a drying agent, such as barium oxide, into the filling material 1103 in advance.

After using the filling material 1103 to glue the cover material 1101, the frame material 1102 is next attached so as to cover a side surface (the exposed surface) of the filling material 1103. The frame material 1102 is glued on by the seal material (functioning as an adhesive) 1104. At this point, it is preferable to use a light cured resin as the seal material 1104. However, a thermally cured resin, as long as the heat resistance of the EL layer permits, may be used. Note that it is desirable to use, as the seal material 1104, a material through which, as much as possible, oxygen and moisture do not penetrate. In addition, a drying agent may be doped into the seal material 1104.

The EL element is thus sealed into the filling material 1103 by using the above procedure, to thereby completely cut off the EL element from the external atmosphere and to prevent the penetration of substances such as moisture and oxygen from the outside which stimulate the deterioration of the EL element due to the oxidation of the EL layer. Accordingly, highly reliable EL display devices can be manufactured.

Embodiment 2

An example of simultaneously forming, in a lengthwise direction or a lateral direction, three types of stripe shape light emitting layers luminescing red, green, and blue color lights was shown in Embodiment 1. An example of a stripe shape light emitting layer formed by dividing it into a plural number of divisions in a longitudinal direction is shown in Embodiment 2.

Figure 12A:
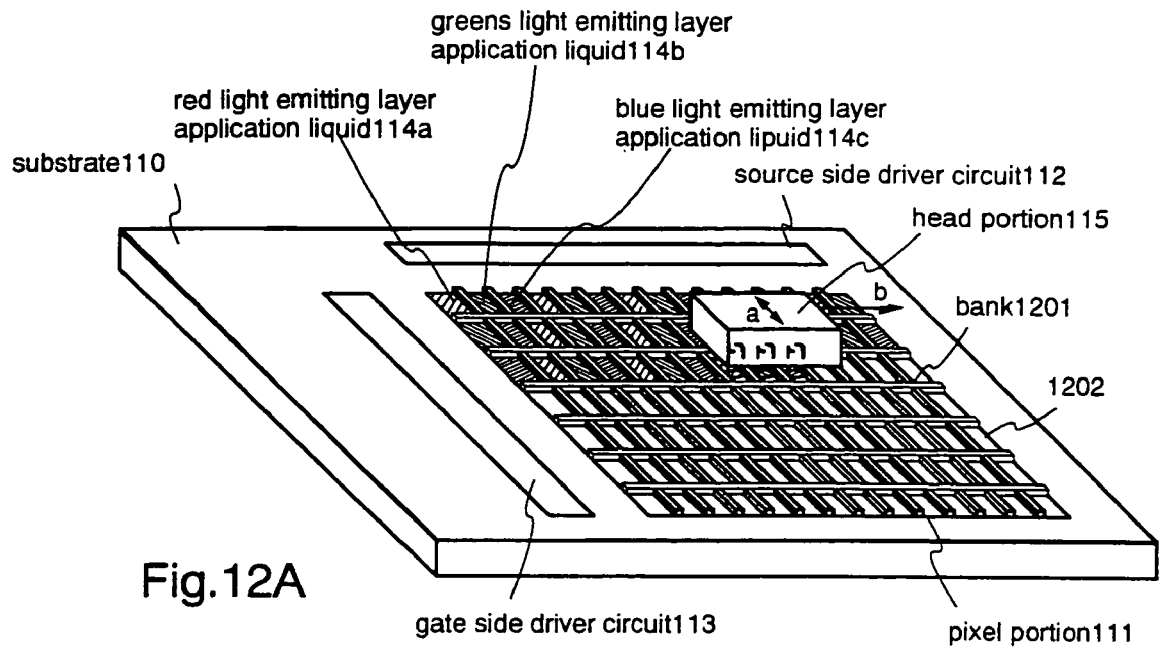
FIGS. 12A and 12B are a diagram showing an application process of an organic EL material of the present invention and an enlarged diagram of the pixel portion, respectively.
Figure 12B:
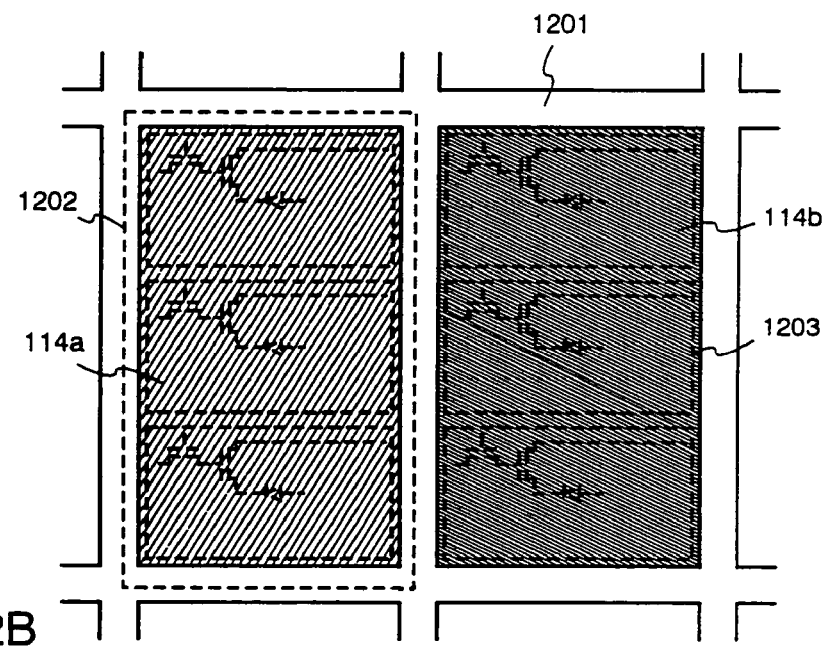

As shown in FIG. 12A, the pixel portion 111, the source side driver circuit 112, and the gate side driver circuit 113, all formed of TFTs, are formed on the substrate 110. The pixel portion 111 is partitioned into matrix by a bank 1201. In the case of Embodiment 2, a plurality of pixels 1203 are arranged within one of the squares 1202 partitioned by the bank 1201 as shown in FIG. 12B. However, the number of pixels is not limited.

In such a state, the film deposition process of an organic EL material for functioning as a light emitting layer is carried out using the thin film deposition apparatus of FIG. 1. Even in this case, the red application liquid 114a, the green application liquid 114b, and the blue application liquid 114c are separately applied to by the head portion 115 at the same time.

Embodiment 2 is characterized by the fact that the application liquids 114a to 114c can be applied separately to the above stated respective squares 1202. In other words, the application liquids of each color, red, green, and blue, can only be applied separately in a stripe shape in the method of FIG. 1, whereas in Embodiment 2, the colors can be freely arranged in each square. Therefore, as shown in FIG. 12A, it is possible to arrange a color of the application liquid to be applied to an optional square in a manner so that a whole row (or column) is being shifted.

Further, in the square 1202, the provision of one pixel is also possible, and in this case, the pixel structure can be adopted which is generally referred to as delta arrangement (a pixel structure in which pixels corresponding to the respective colors RGB are arranged so as to always form a triangle).

Operations imparted to the head portion 115 for the purpose of implementing Embodiment 2 are as follows. First, the head portion 115 is moved to the direction indicated by the arrow a, to thereby completely soak the inside of three squares (the respective squares corresponding to the colors red, green, and blue) with the application liquids. After completing this operation, the head portion 115 is moved to the direction indicated by the arrow b, to thereby apply the application liquid to the next three squares. The application liquids are applied to the pixel portion by repeating this operation. Thereafter, the solvent is volatilized by heat treatment to form an organic EL material.

In an example described in the conventional ink-jet method, the organic EL material formed for the application of liquid drops becomes circular. Therefore, it is difficult to cover the entire long and narrow pixel. Particularly, in the case of Embodiment 1 in which the entire pixel functions as a light emitting region, the entire pixel needs to be covered by the organic EL material. On the other hand, Embodiment 2 has a merit in that the squares can be completely filled with the application liquids by moving the head portion 115 in the direction indicated by the arrow a.

Note that the constitution of Embodiment 2 may be utilized in manufacturing the EL display device described in Embodiment 1. The bank 1201 may be formed into a matrix shape by patterning, and the operations of the head portion 115 may be electrically controlled.

Embodiment 3

Figure 13:
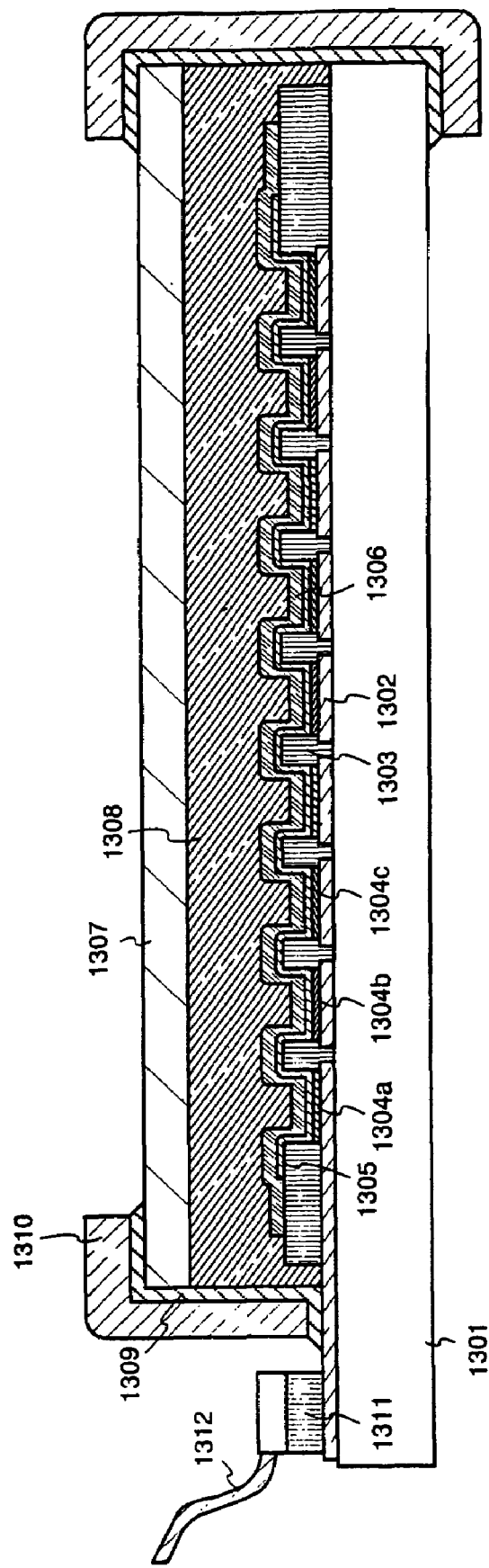
FIG. 13 is a diagram showing the cross-sectional structure of a passive type EL display device.

A case of employing the present invention in a passive type (simple matrix type) EL display device is explained in Embodiment 3 with reference to FIG. 13. In FIG. 13, reference numeral 1301 denotes a plastic substrate and 1302 denotes a cathode made of an aluminum alloy film. The cathode 1302 is formed by the evaporation method in Embodiment 3. Note that although not shown in FIG. 13, a plural number of lines of cathodes are arranged in a stripe shape, in a perpendicular direction on a defined space.

Further, a bank 1303 is formed so as to fill up the spaces between the cathodes 1302 arranged in stripes. The bank 1303 is formed along the cathodes 1302 in a perpendicular direction on the defined space.

Subsequently, light emitting layers 1304a to 1304c made of a high molecular organic EL material are formed by the film deposition method employing the thin film deposition apparatus of FIG. 1. Of course, reference numeral 1304a is a light emitting layer luminescing red color, 1304b is a light emitting layer luminescing green color, and 1304c is a light emitting layer luminescing blue color. An organic EL material similar to that of Embodiment 1 may be used in Embodiment 3. Since these light emitting layers are formed along the grooves, which are formed by the bank 1302, these layers are arranged in a stripe shape, in a perpendicular direction on the defined space.

Thereafter, a hole injection layer 1305, common for all the pixels, is formed by the spin coating method or the printing method. The hole injection layer may also be similar to the one of Embodiment 1. In addition, an anode 1306 made of a transparent conductive film is formed on the hole injection layer 1305. In Embodiment 3, a compound of indium oxide and zinc oxide formed by the evaporation method is formed as the transparent conductive film. Note that although not shown in FIG. 13, the parallel direction of a plural number of lines of anodes on the defined space is the longitudinal direction, and that the anodes 1306 are arranged in a stripe shape so as to intersect the cathodes 1302. Furthermore, a wiring, not shown in the drawing, is drawn to a portion where an FPC will be attached later so that a predetermined voltage can be applied to the anodes 1306.

Further, after the formation of the anode 1306, a silicon nitride film as a passivation film, not shown in the drawing, may be provided.

An EL element is thus formed on the substrate 1301. Note that since a lower side electrode is a light-shielding cathode, light generated by the light emitting layers 1304a to 1304c is irradiated to an upper surface (a surface opposite the substrate 1301). However, the lower side electrode can be transmissive anode by reversing the structure of the EL element. In that case, light generated by the light emitting layers 1304a to 1304c is irradiated to a lower surface (the substrate 1301).

A plastic plate is prepared as a cover material 1307. A light-shielding film or a color filter may be formed on the surface when necessary. In the structure of Embodiment 3, the cover material 1307 is transmissive because light emitted from the EL element penetrates the cover material 1307 and enters the eyes of an observer. A plastic plate is used in Embodiment 3, but a glass plate and a transmissive substrate (or a transmissive film) such as a PVF film may be used. Of course, as explained previously, in the case of reversing the structure of the EL element, the cover material may have light shielding characteristics. Hence, a ceramic substrate, etc. can be used.

When the cover material 1307 is thus prepared, it is then pasted on the substrate by a filling material 1308 that is doped with a barium oxide as a drying agent (not shown in the figure). Then, frame material 1310 is attached by using a seal material 1309 made of an ultraviolet cured resin. A stainless material is used as the frame material 1310 in Embodiment 3. Finally, an FPC 1312 is attached via a conductive paste 1311, thereby completing a passive type EL display device.

Embodiment 4

When the active matrix EL display device of the present invention is seen from the direction of FIG. 11A, the rows of pixel may be formed in a lengthwise direction or lateral direction. In other words, the arrangement of the pixels becomes such as that of FIG. 14A in the case of forming the rows of pixels in the lengthwise direction. On the other hand, the arrangement of the pixels becomes such as that of FIG. 14B in the case of forming the rows of pixels in the lateral direction.

Figure 14A:
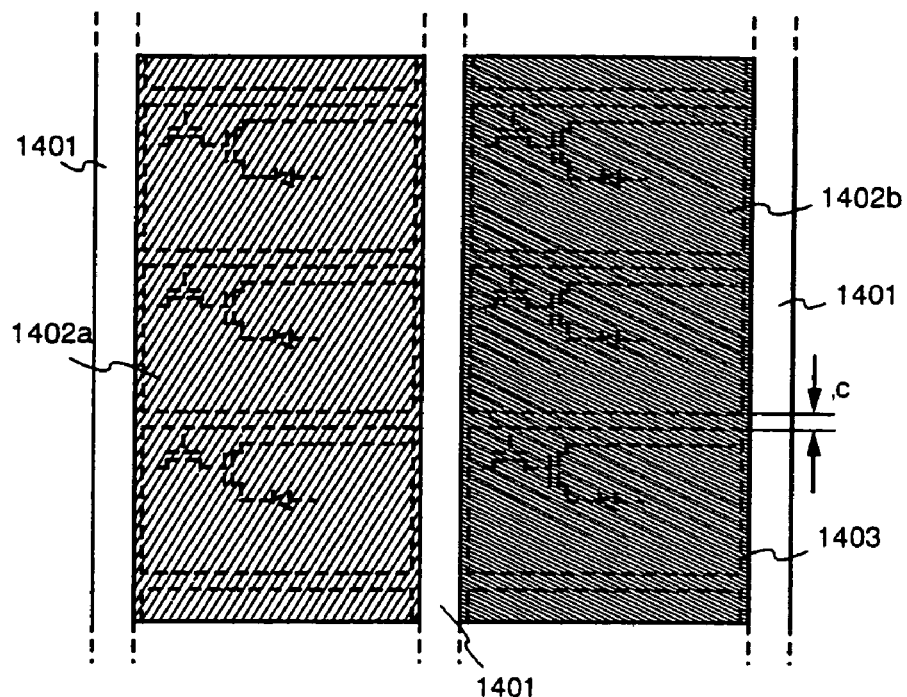
FIGS. 14A and 14B are enlarged diagrams of the pixel portion.

In FIG. 14A, reference numeral 1401 denotes a bank formed into a stripe shape in the lengthwise direction, 1402a denotes an EL layer luminescing a red color, and 1402b denotes an EL layer luminescing green color. An EL layer luminescing blue color (not shown in the figure) is, of course, formed next to the EL layer 1402b luminescing green color. It is to be noted that in the upper direction of a source wiring via an insulating film, the bank 1401 is formed along the source wiring.

The EL layer referred to here indicates a layer made of an organic EL material which contributes to the luminescing of layers such as a light emitting layer, a charge injection layer, and a charge transporting layer. There are cases of forming a light emitting layer as a single layer. However, in the case of forming a laminate layer of a hole injection layer and a light emitting layer, for example, this laminate film is called an EL layer.

At this point, it is desirable that a mutual distance (D) of pixels 1403 indicated by the dotted line is set to be 5 times or greater (preferably 10 times or greater) than the film thickness (t) of the EL layer. The reason for this resides in that if $D<5\,t$, the problem of cross-talk may occur between pixels. Note that if the distance (D) between pixels is also too far apart, high definition images cannot be obtained. Therefore, it is preferable that the distance (D) is $5\,t<D<50\,t$ (preferably $10\,t<D<35\,t$).

Figure 14B:
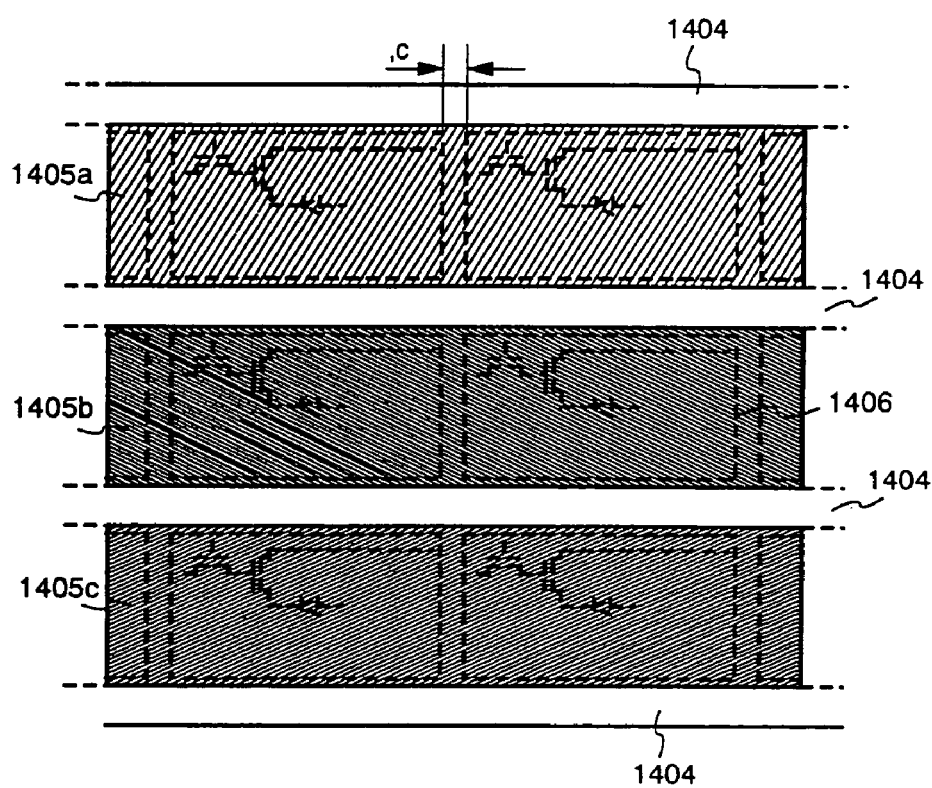

Further, in FIG. 14B, reference numeral 1404 denotes a bank formed into a stripe shape in the lateral direction, 1405a denotes an EL layer luminescing red color, 1405b denotes an EL layer luminescing green color, and 1405c denotes an EL layer luminescing blue color. It is to be noted that in the upper direction of a gate wiring via an insulating film, the bank 1404 is formed along the gate wiring.

Also in this case, it is appropriate that a mutual distance (D) of pixels 1406 indicated by the dotted line is set to be 5 times or greater (preferably 10 times or greater) than the film thickness (t) of the EL layer, and further it is preferable that the distance (D) is $5\,t<D<50\,t$ (preferably $10\,t<D<35\,t$).

Note that the constitution of Embodiment 4 may be implemented by combining it with any of the constitutions of Embodiments 1 to 3. By regulating the relationship between the distance of the pixels and the film thickness of the EL layer as in Embodiment 4, it becomes possible to display high definition images without cross-talk.

Embodiment 5

An example of forming all the light emitting layers, the light emitting layer luminescing red color, the light emitting layer luminescing green color, and the light emitting layer luminescing blue color, by utilizing the thin film deposition apparatus of FIG. 1 was illustrated in Embodiment 1. However, the light emitting layer formed by using the thin film deposition apparatus of FIG. 1 may be a layer for at least one of the colors, red, green, and blue.

That is, in FIG. 1B, the nozzle 116c (a nozzle for applying the blue light emitting layer application liquid) is omitted. It is also possible to apply the blue light emitting layer application liquid 114c by other application means. An example of this is shown in FIG. 15.

Figure 15:
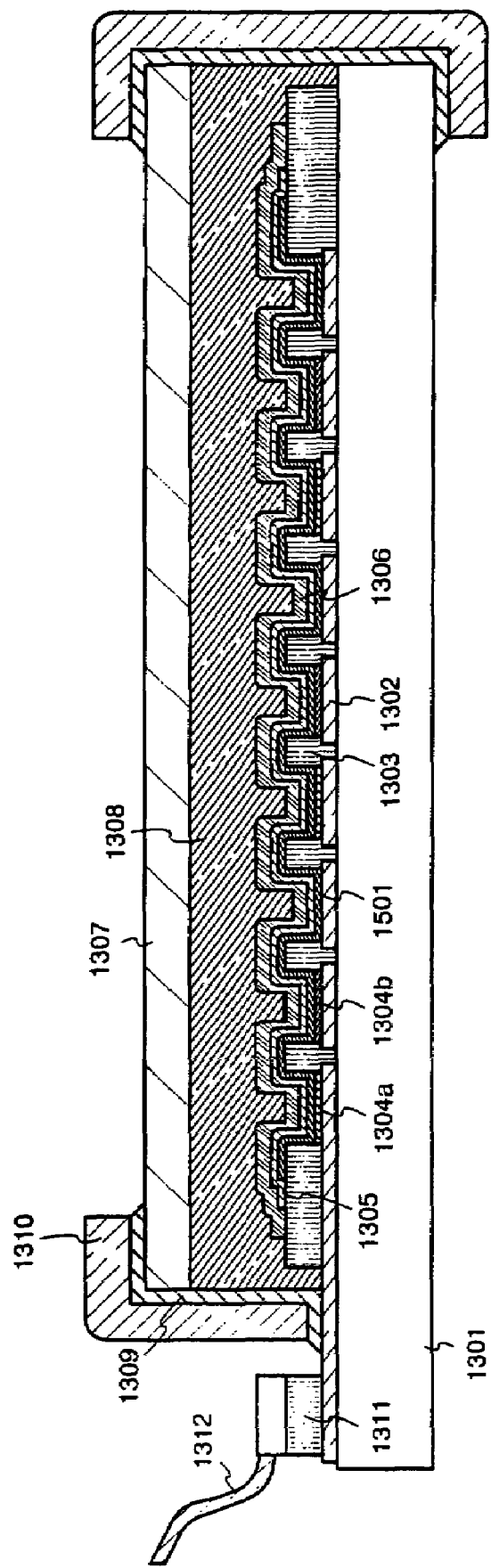
FIG. 15 is a diagram showing a cross-sectional structure of a passive type EL display device.

Shown in FIG. 15 is an example of a case in which the constitution of Embodiment 5 is employed in the passive type EL display device illustrated in Embodiment 3. The basic structures are the same as those of the passive type EL display device shown in FIG. 13, and therefore only the reference numerals of different portions are changed and explained.

In FIG. 15, after forming the cathode 1302 on the substrate 1301, the light emitting layer 1304a luminescing red color and the light emitting layer 1304b luminescing green color are formed by utilizing the thin film deposition apparatus of FIG. 1. Then, a light emitting layer 1501 luminescing blue color is formed thereon by the spin coating method, the printing method, or the evaporation method. In addition, the hole injection layer 1305 and the anode 1306 are formed.

Thereafter, the filling material 1308, the cover material 1307, the seal material 1309, the frame material 1310, the conductive paste 1311, and the FPC 1312 are formed in accordance with the explanation of Embodiment 3, to thereby complete the passive type EL display device of FIG. 15.

The case of Embodiment 5 is characterized in that the light emitting layer 1304a luminescing red color, the light emitting layer 1304b luminescing green color, and the light emitting layer 1501 luminescing blue color are formed by different means. Of course, the colors may be freely combined, and the light emitting layer luminescing green color may be formed by the spin coating method, the printing method, or the evaporation method instead of the above-mentioned light emitting layer luminescing blue color.

In addition, the light emitting layer luminescing green color is formed by using the injection device of FIG. 1, and the light emitting layer luminescing red color and the light emitting layer luminescing blue color may be formed by the spin coating method, the printing method, or the evaporation method. Even in this case, the colors can be freely combined.

According to the structure of Embodiment 5, of the light emitting pixels, the red light emitting pixel, the green light emitting pixel, and the blue light emitting pixel, at least one has a structure that is a laminate layer of two different types of light emitting layers as the light emitting layer. In this case, of the two different types of light emitting layers, either one emits one of the colors due to the mobility of energy. However, whichever color light will be emitted can be examined in advance. Thus, it is appropriate to design the structure so that the colors, red, green, and blue can be finally obtained.

As an advantageous point of structuring the light emitting layer as a laminate layer, such as the one stated above, the point that the possibility of a short circuit caused by a pinhole becomes low can be cited. Since the light emitting layer is very thin, the occurrence of short circuit in the cathode and anode caused by the pinhole becomes a problem. However, the filling up of the pinhole is carried out by structuring a laminate layer, and therefore the possibility of a short circuit occurring can be greatly reduced. In such a meaning, it is effective to form the light emitting layer that is provided on the upper layer of the laminate structure by the evaporation method where it is difficult for pinholes to occur.

Note that in Embodiment 5, an explanation was made taking the passive type EL display device as an example. However, the active matrix EL display device may also be employed. Accordingly, the constitution of Embodiment 5 may be implemented by freely combining it with the constitution of any of Embodiments 1 to 4.

Embodiment 6

Figure 16:
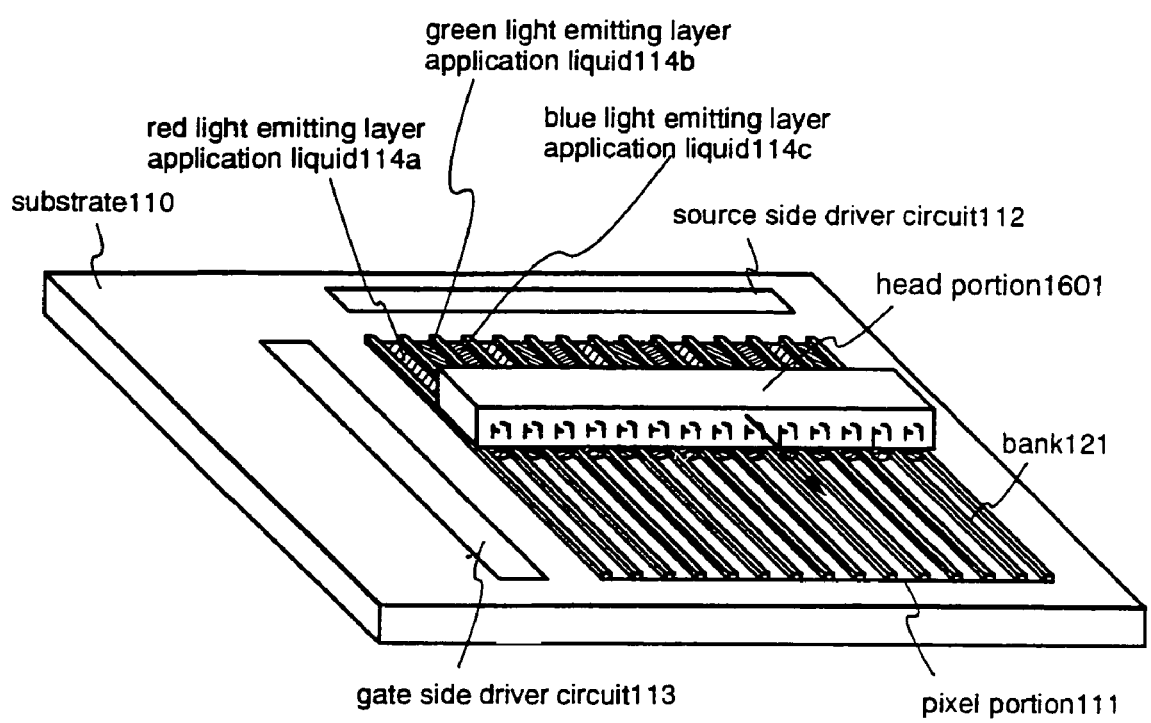
FIG. 16 is a diagram showing an application process of an organic EL material of the present invention.

An example of the head portion 115 in which 3 nozzles are attached thereto is shown in FIG. 1. However, the head portion may be further attached with 3 or more nozzles in correspondence with the plurality of rows of pixels, an example of which is shown in FIG. 16. It is to be noted that the letters R, G, and B correspond to red, green, and blue respectively.

Shown in FIG. 16 is an example of collectively applying an organic EL material (strictly application liquid) to all the rows of pixels formed in the pixel portion. That is, the number of nozzles attached to a head portion 1601 is the same as the number of rows of pixels. By constructing such a structure, it becomes possible to apply the application liquid to the entire rows of pixels in one scan, thereby making a rapid increase in throughput.

Further, the pixel portion is divided into a plurality of zones. A head portion provided with the same number of nozzles as the number of rows of pixels contained in each zone may be employed. In other words, if the pixel portion is divided into n number of zones, then the organic EL material (strictly application liquid) can be applied to all the rows of pixels by scanning n number of times.

Since there are actually cases where the size of the pixels are small, several tens of μm, then the width of a pixel row is also about several tens of μm. In such a case, the arrangement of the nozzles needs to be contrived because it is difficult to arrange the nozzles in one horizontal row.

Figure 17A:
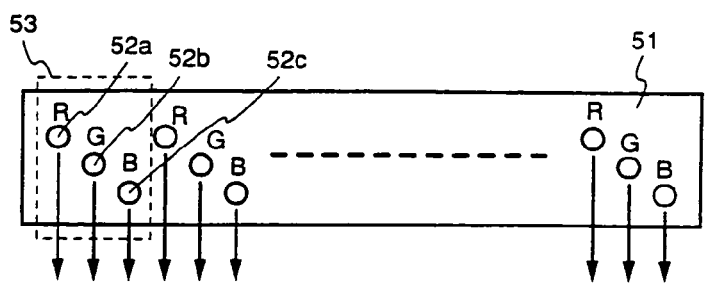
FIGS. 17A to 17C are diagrams showing the arrangement of nozzles in the head portion.

Shown in FIG. 17 is an example in which the attachment positions of the nozzles to the head portion are altered. In FIG. 17A, nozzles 52a to 52c are formed on the head portion 51 while shifting their attachment positions diagonally. Note that reference numeral 52a denotes a nozzle for applying red light emitting layer application liquid, 52b denotes a nozzle for applying green light emitting layer application liquid, and 52c denotes a nozzle for applying blue light emitting layer application liquid. Further, each of the arrows corresponds to a pixel row.

The nozzles 52a to 52c are then considered as one unit as indicated by reference numeral 53. Thus, the head portion is provided with one to several numbers of units. If there is one unit 53, then the organic EL material can be applied to 3 rows of pixels at the same time. This means that if there are n numbers of units, then the organic EL material can be applied to n numbers of 3 rows of pixels at the same time.

By forming such a structure, the degree of freedom in the arrangement space of nozzles is raised, making it possible to implement the present invention in a highly detailed pixel portion without much difficulty. In addition, the head portion 51 of FIG. 17A may be used in collectively processing (applying the application liquid thereto) all the rows of pixels in the pixel portion, or may be used in the case where the pixel portion is divided into a plurality of zones and the process of the rows of pixels is divided into several times.

Figure 17B:
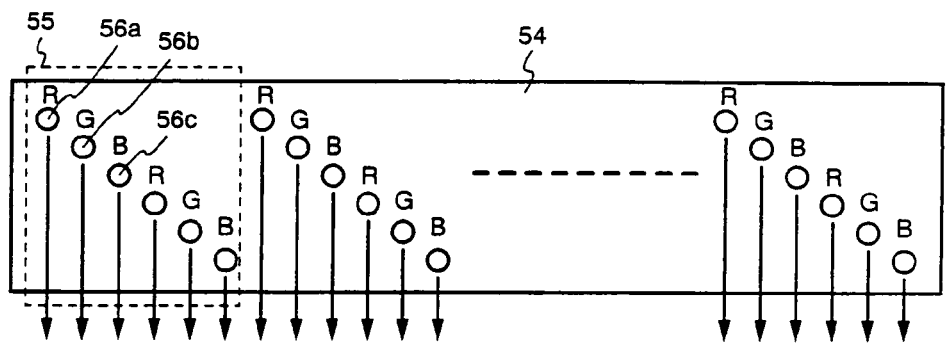

A head portion 54 shown in FIG. 17B is a modified version of FIG. 17A. It is an example of a case of increasing the number of nozzles contained in one unit 55. In other words, 2 nozzles 56a for applying the red light emitting layer application liquid, 2 nozzles 56b for applying the green light emitting layer application liquid, and 2 nozzles 56c for applying the blue light-emitting layer application liquid are contained in the unit 55. Hence, a total of 6 rows of pixels can be applied with the organic EL material at the same time by one unit 55.

One to a plural number of the above-mentioned unit 55 can be provided in Embodiment 6. If there is only one unit 55, then the organic EL material can be applied to 6 rows of pixels at the same time. If there are n numbers of unit 55, then the organic EL material can be applied to n numbers of 6 rows of pixels at the same time. Of course, the number of nozzles provided in the unit 55 is not necessarily limited to 6, but an additional number of nozzles may be provided.

In the case of such structure, similarly to the case of FIG. 17A, all the rows of pixels in the pixel portion can be collectively processed, or it is possible to divide the process into several times when the pixel portion is divided into a plurality of zones.

Figure 17C:
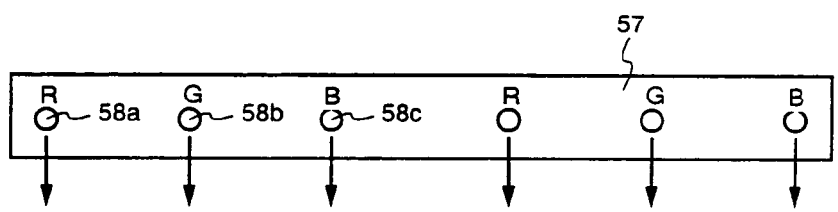

In addition, a head portion such as a head portion 57 shown in FIG. 17C can be used. In the head portion 57, a space for 3 rows of pixels is opened for provision of a nozzle 58a for applying the red light emitting layer application liquid, a nozzle 58b for applying the green light emitting layer application liquid, and a nozzle 58c for applying the blue light emitting layer application liquid.

First, the head portion 57 is scanned once to apply the organic EL material to the rows of pixels. Next, the head portion 57 is shifted by 3 rows of pixel to the right and scanned again. Then the head portion is further shifted by 3 rows of pixels to the right and scanned again. Scanning is thus performed 3 times, whereby the organic EL material can be applied to the stripes lined in the order of red, green, and blue.

Also in the case of such a structure, similarly to the case of FIG. 17A, all the rows of pixels in the pixel portion can be collectively processed, or it is possible to divide the process into several times when the pixel portion is divided into a plurality of zones.

Thus, in the thin film deposition apparatus of FIG. 1, by contriving the position of nozzles to be attached to the head portion, the present invention may also be implemented in a highly detailed pixel portion having very narrow pixel pitches (the distance between pixels). Furthermore, the throughput of the manufacturing process can be increased.

Note that the constitution of Embodiment 6 may be implemented by freely combining it with the constitution of any of Embodiments 1 to 5.

Embodiment 7

When the present invention is implemented to manufacture an active matrix EL display device, it is effective to use a silicon substrate (silicon wafer) as a substrate. In the case of using the silicon substrate as the substrate, a manufacturing technique of MOSFET utilized in the conventional IC, LSI or the like can be employed to manufacture a switching element and a current control element to be formed in the pixel portion, or a driver element to be formed in the driver circuit portion.

The MOSFET can form circuits having extremely small variations as in its achievements in the IC and the LSI. Particularly, it is effective for an analog driver of the active matrix EL display device for performing gradation display by an electric current value.

It is to be noted that the silicon substrate is not transmissive, and therefore the structure needs to be constructed so that light from the light emitting layer is irradiated to a side opposite the substrate. The structure of the EL display device of Embodiment 7 is similar to that of FIG. 11. However, the point of difference is that the MOSFET is used for forming a pixel portion 702 and a driver circuit portion 703 instead of a TFT.

Embodiment 8

An EL display device formed by implementing the present invention has superior visibility in bright locations in comparison to a liquid crystal display device because it is a self-emissive type device, and moreover its field of vision is wide. Accordingly, it can be used as a display portion for various electronic devices. For example, it is appropriate to use the EL display device of the present invention as a display portion of an EL display (a display incorporating the EL display device in its casing) having a diagonal equal to 30 inches or greater (typically equal to 40 inches or greater) for appreciation of TV broadcasts by large screen.

Note that all displays exhibiting (displaying) information such as a personal computer display, a TV broadcast reception display, or an advertisement display are included as the EL display. Further, the EL display device of the present invention can be used as a display portion of the other various electronic devices.

The following can be given as examples of such electronic devices: a video camera; a digital camera; a goggle type display (head mounted display); a car navigation system; an audio reproducing device (such as a car audio system, an audio compo system): a notebook personal computer; a game equipment; a portable information terminal (such as a mobile computer, a mobile telephone, a mobile game equipment or an electronic book); and an image playback device provided with a recording medium (specifically, a device which performs playback of a recording medium and is provided with a display which can display those images, such as a digital video disk (DVD)). In particular, because portable information terminals are often viewed from a diagonal direction, the wideness of the field of vision is regarded as very important. Thus, it is preferable that the EL display device is employed. Examples of these electronic devices are shown in FIGS. 18A to 19B.

Figure 18A:
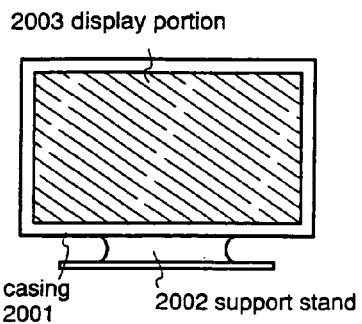
FIGS. 18A to 18F are diagrams showing specific examples of electronic equipment.

FIG. 18A is an EL display, containing a casing 2001, a support stand 2002, and a display portion 2003. The present invention can be used in the display portion 2003. Since the EL display is a self-emissive type device without the need of a backlight, its display portion can be made thinner than a liquid crystal display device.

Figure 18B:
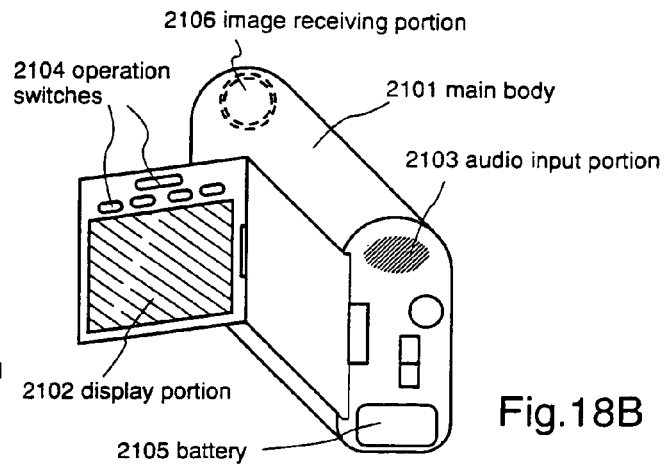

FIG. 18B is a video camera, containing a main body 2101, a display portion 2102, an audio input portion 2103, operation switches 2104, a battery 2105, and an image receiving portion 2106. The EL display device of the present invention can be used in the display portion 2102.

Figure 18C:
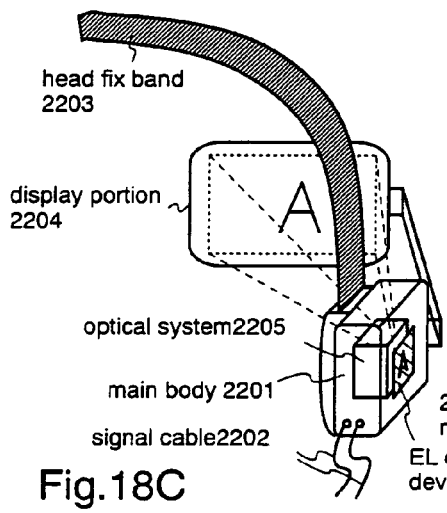

FIG. 18C is a portion of a head fitting type EL display (right side), containing a main body 2201, a signal cable 2202, a head fixing band 2203, a display portion 2204, an optical system 2205, and an EL display device 2206. The present invention can be used in the EL display device 2206.

Figure 18D:
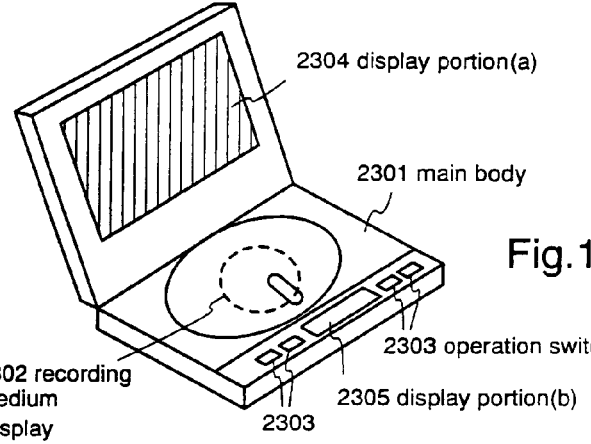

FIG. 18D is an image playback device (specifically, a DVD playback device) provided with a recording medium, containing a main body 2301, a recording medium (such as a DVD) 2302, operation switches 2303, a display portion (a) 2304, and a display portion (b) 2305. The display portion (a) is mainly used for displaying image information, and the image portion (b) is mainly used for displaying character information, and the EL display device of the present invention can be used in the image portion (a) and in the image portion (b). Note that domestic game equipment is included as the image playback device provided with a recording medium.

Figure 18E:
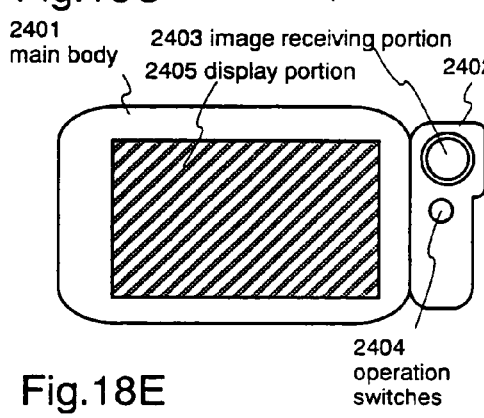

FIG. 18E is a mobile computer, containing a main body 2401, a camera portion 2402, an image receiving portion 2403, operation switches 2404, and a display portion 2405. The EL display device of the present invention can be used in the display portion 2405.

Figure 18F:
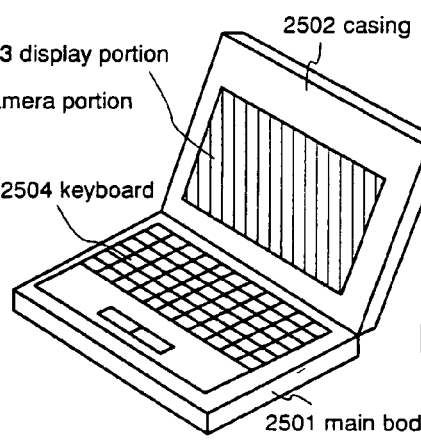

FIG. 18F is a personal computer, containing a main body 2501, a casing 2502, a display portion 2503, and a keyboard 2504. The EL display device of the present invention can be used in the display portion 2503.

Note that in the future if the emission luminance of EL materials becomes higher, the projection of light including outputted images can be enlarged by lenses or the like. Then it will become possible to use the EL display device of the present invention in a front type or a rear type projector.

The above electronic devices are becoming more often used to display information provided through an electronic transmission circuit such as the Internet or CATV (cable television), and in particular, opportunities for displaying animation information are increasing. The response speed of EL materials is extremely high, and therefore the EL display device is favorable for performing animation display. However, the contours between pixels become hazy, whereby the entire animation also becomes hazy. Accordingly, it is extremely effective to use the EL display device of the present invention in the display portion of electronic equipment because of its capability of clarifying the contours between pixels.

The emitting portion of the EL display device consumes power, and therefore it is preferable to display information so as to have the emitting portion become as small as possible. Therefore, when using the EL display device in a display portion which mainly displays character information, such as a portable information terminal, in particular, a portable telephone and an audio reproducing device, it is preferable to drive it by setting non-emitting portions as background and forming character information in emitting portions.

Figure 19A:
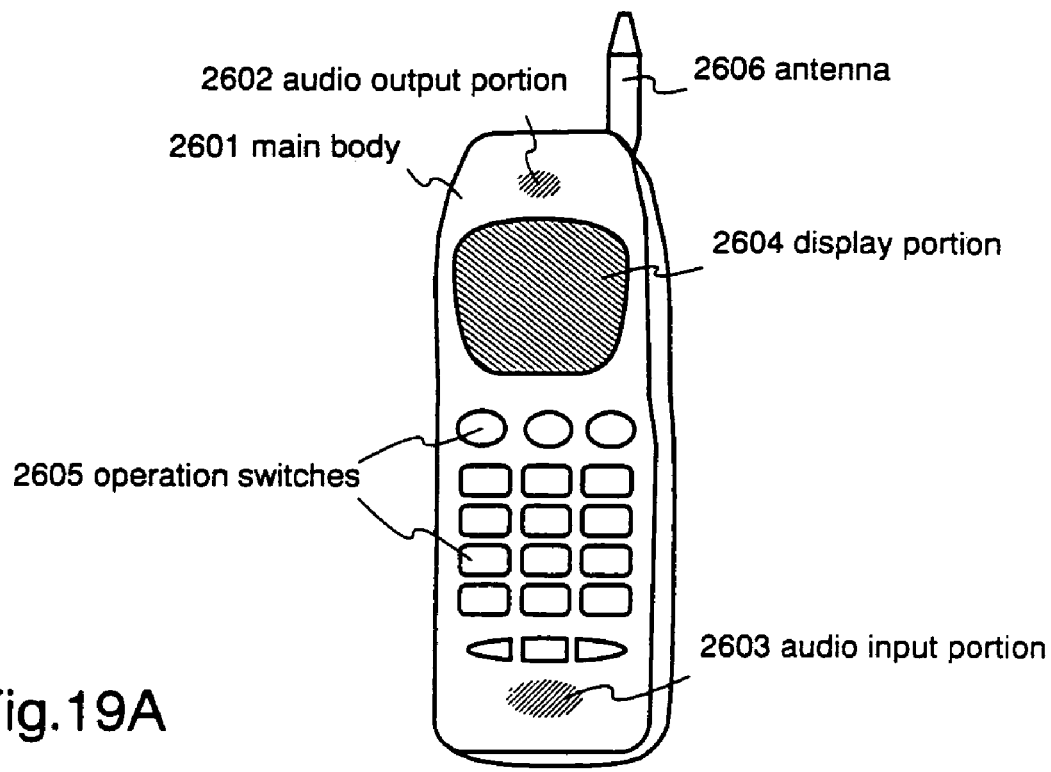
FIGS. 19A and 19B are diagrams showing specific examples of electronic equipment.

FIG. 19A is a portable telephone, containing a main body 2601, an audio output portion 2602, an audio input portion 2603, a display portion 2604, operation switches 2605, and an antenna 2606. The EL display device of the present invention can be used in the display portion 2604. Note that by displaying white characters in a black background in the display portion 2604, the power consumption of the portable telephone can be reduced.

Figure 19B:
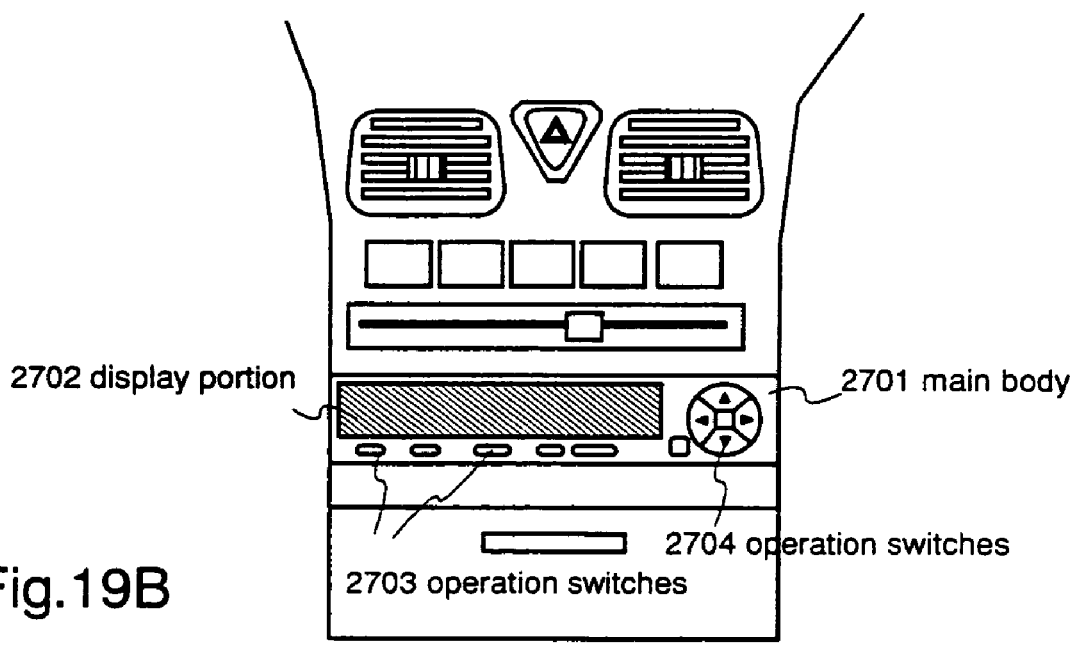

FIG. 19B is an audio reproducing device, specifically a car audio system, containing a main body 2701, a display portion 2702, and operation switches 2703 and 2704. The EL display device of the present invention can be used in the display portion 2702. Furthermore, an audio reproducing device for a car is shown in Embodiment 8, but it may also be used for a mobile type and a domestic type of audio reproducing device. Note that by displaying white characters in a black background in the display portion 2704, the power consumption can be reduced. This is particularly effective in a mobile type audio reproducing device.

The range of applications of the present invention is thus extremely wide, and it is possible to apply the present invention to electronic devices in all fields. Furthermore, any constitution of the EL display device shown in Embodiments 1 to 7 may be employed in the electronic devices of Embodiment 8.

Embodiment 9

Figure 20:
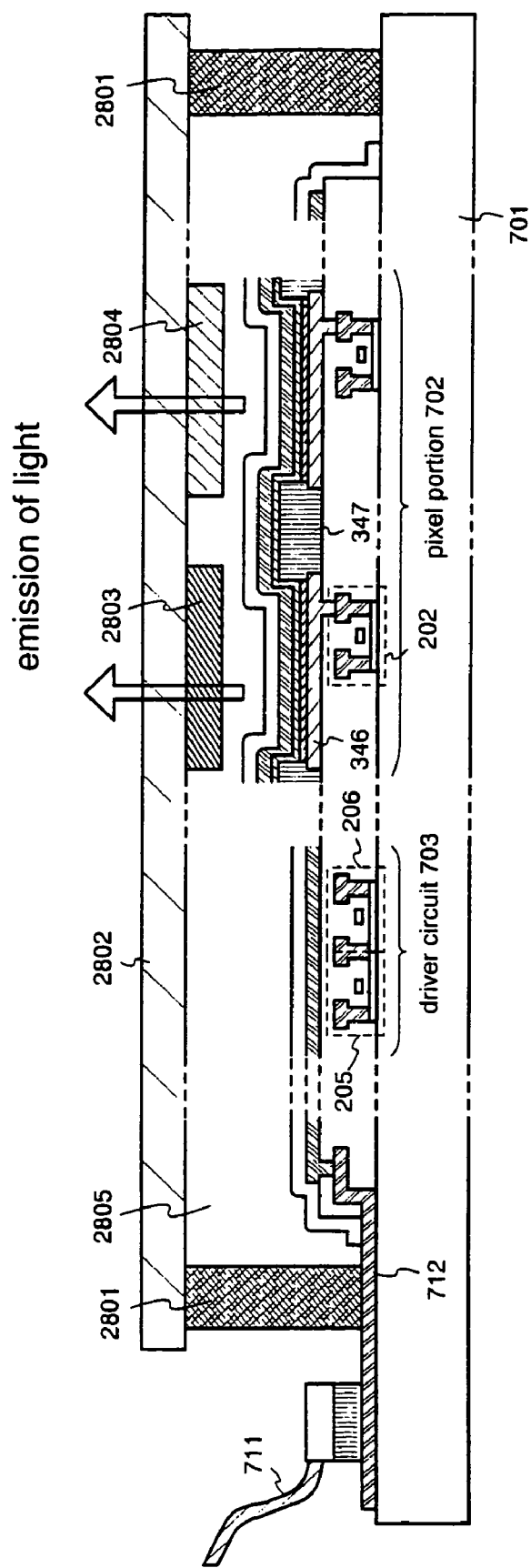
FIG. 20 is a diagram showing a cross-sectional structure of an active matrix EL display device.

In Embodiment 9, a case in which a method of enclosing an EL element different from that of the cross-sectional structure of the EL display device shown in FIG. 11 in Embodiment 1 will be explained with reference to FIG. 20. Note that processes up through the formation of the active matrix substrate of Embodiment 9 is similar to those of Embodiment 1, and their explanation is therefore omitted.

The active matrix substrate formed in accordance with Embodiment 1 is provided with a seal material 2801, and a cover material 2802 is glued thereto. Resins that have adhesive properties such as an ultraviolet cured resin may be used as the seal material 2801. In particular, it is preferable to use resins through which, as much as is possible, moisture is not permeated and as little as possible of gas leakage. In addition, materials that can extract light emitted from an EL element formed in substrates such as a glass substrate, a plastic substrate, or a ceramic substrate provided with a window member having light transparency characteristics may be used as the cover material 2802.

In Embodiment 9, the seal material 2801 made of an ultraviolet cured resin is formed so as to encircle the pixel portion 702 and the driver circuit portion 703 by using a dispenser, and then the cover material 2802 made of plastic is adhered thereto. Next, the seal material 2801 is cured by irradiating ultraviolet rays, thereby bonding the cover material 2802 to the active matrix substrate.

Note that color filters 2803 and 2804 made of resin are provided on the cover material 2802 made of plastic before it is adhered to the substrate. The color filters 2803 and 2804 are provided above each of the pixels to improve the color purity of the light emitted from the EL element. It does not matter if the color filters are not provided.

A closed space 2805 formed by the active matrix substrate, the cover material 2802, and the seal material 2801 is filled with inert gas (specifically nitric gas or noble (rare) gas). In order to do this, it is appropriate to perform the process of bonding the active matrix substrate and the cover material in inert gas. Furthermore, it is effective to provide a drying agent such as barium oxide inside the closed space 2805. It is also possible to additionally dope a drying agent in the seal material 2801, the cover material 2802, or the color filters 2803 and 2804.

Note that it is possible to implement the constitution of Embodiment 9 by freely combining it with the constitution of any of Embodiments 1 to 7. The EL display device obtained by implementing Embodiment 9 may be employed in any of the electronic equipment of Embodiment 8.

Embodiment 10

A case of manufacturing a plural number of the EL display devices of the present invention on a large substrate is explained in Embodiment 10. The explanation is made using the top views shown in FIGS. 21A and 21B and FIGS. 22A and 22B. Note that each of the top views has both cross-sectional views taken along line A-A' and line B-B'.

Figure 21A:
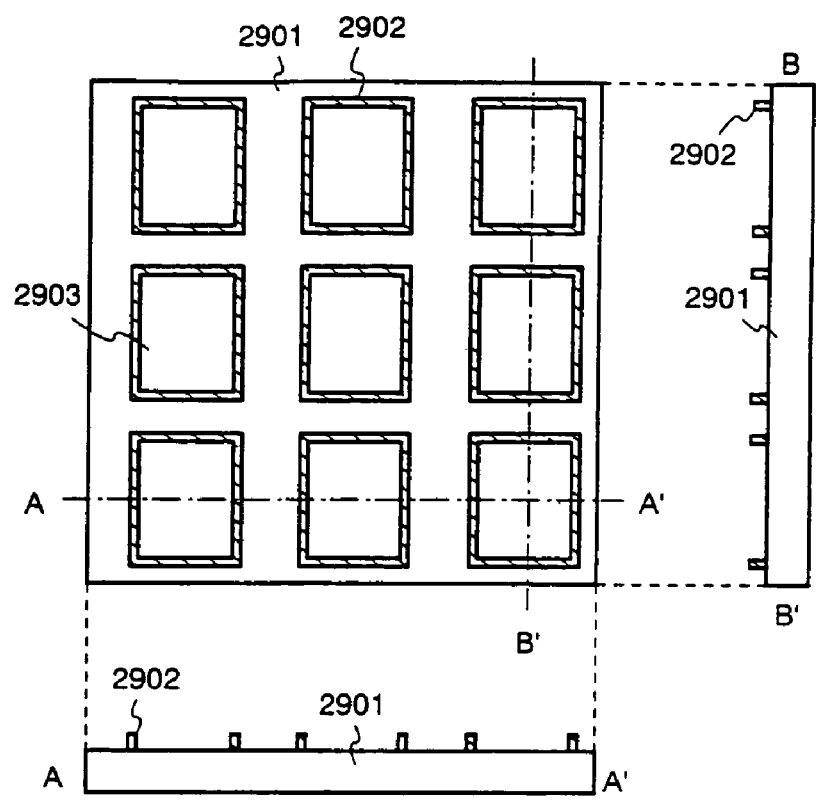
FIGS. 21A and 21B are diagrams showing a bonding process of a substrate.

FIG. 21A shows the state of an active matrix substrate, which is formed in accordance with any one of the Embodiments 1 to 7, with seal materials formed thereon. Reference numeral 2901 denotes the active matrix substrate having seal materials 2902 provided in several places.

A pixel portion and a driver circuit portion of the EL display device are contained inside the respective regions surrounded by the seal materials 2902. That is, a plurality of active matrix portions 2903, each made up of a combination of the pixel portion and the driver circuit portion, are formed on one large substrate, the active matrix substrate 2901. Typically, a substrate having an area of 620 mm×720 mm or 400 mm×500 mm is used as a large substrate. Of course, substrates having other areas may be used.

Figure 21B:
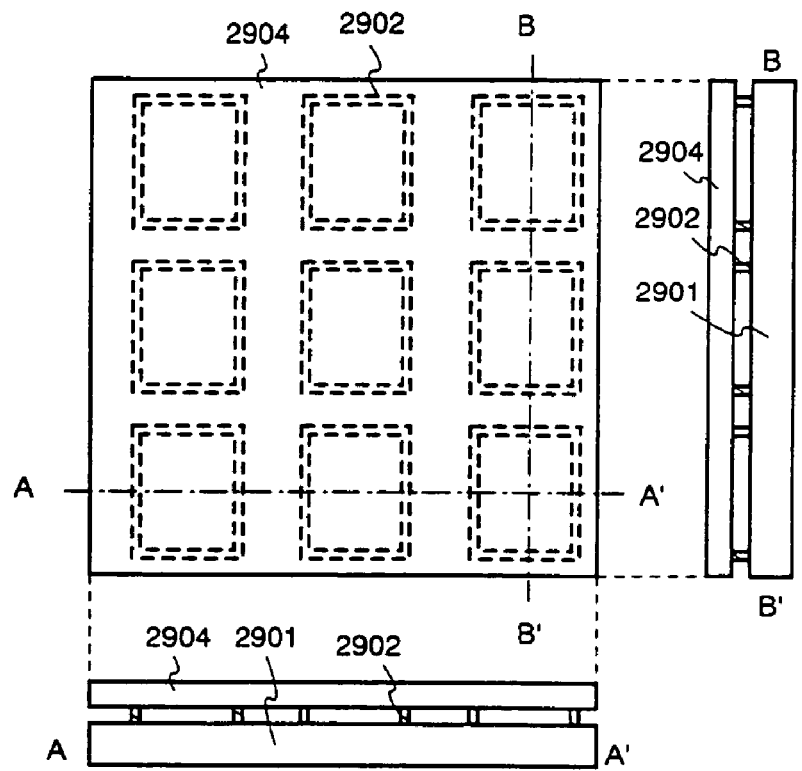

FIG. 21B shows a state in which a cover material 2904 is adhered to the active matrix substrate 2901. A substrate having an area that is the same as that of the active matrix substrate 2901 may be used for the cover material 2904. Accordingly, in the state shown in FIG. 21B, a common cover material can be used for all the active matrix portions.

Figure 22A:
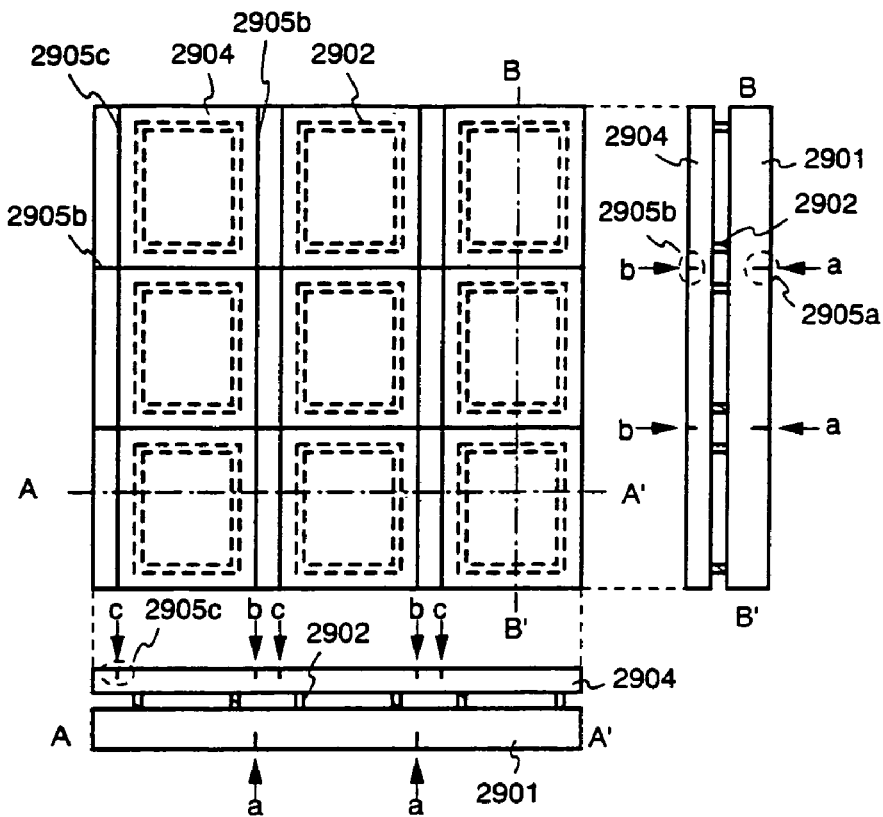
FIGS. 22A and 22B are diagrams showing a dividing process of a substrate.
Figure 22B:
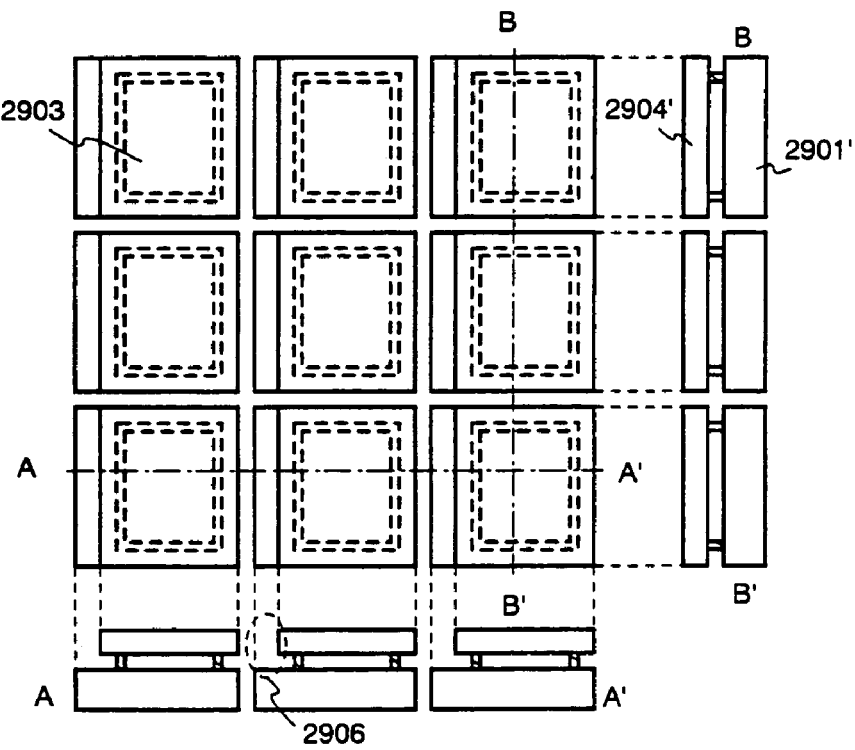

Next, a process of cutting the active matrix substrate in the state shown in FIG. 21 B is explained with reference to FIGS. 22A and 22B.

In Embodiment 10, the cutting of the active matrix substrate 2901 and the cover material 2904 is conducted by using a scriber. The scriber is a device for cutting a substrate by first forming narrow grooves (scribe grooves) in the substrate and then applying impact to the scribe grooves to generate fissures along the scribe grooves, thereby cutting the substrate.

It is to be noted that as another device for cutting a substrate, a dicer is known. The dicer is a device in which a hard cutter (also referred to as a dicing saw) is rotated at a very high speed and applied to the substrate It is to be noted that as another device for cutting a substrate, the dicer is known. The dicer is a device in which a hard cutter (also referred to as a dicing saw), rotating at a very high speed, is applied to the substrate to cut the substrate. However, when using the dicer, the dicing saw is sprayed with water in order to prevent the heat generation and the scattering of polish dust. Therefore, when manufacturing the EL display device, it is desirable to employ the scriber, in which there is no need to use water.

The order of forming scribe grooves in the active matrix substrate 2901 and the cover material 2904 is as follows. First, a scribe groove 2905a is formed in the direction indicated by the arrow (a), then a scribe groove 2905b is formed in the direction indicated by the arrow (b), and finally, a scribe groove 2905c is formed in the direction indicated by the arrow (c).

When the scribe grooves are formed, impact is applied to the scribe grooves with a bar, which is made of an elastic material such as silicon resin, to generate fissures and then the active matrix substrate 2901 and the cover material 2904 are cut. FIG. 22B is a diagram showing the state after cutting the active matrix substrate 2901 and the cover material 2904. In this drawing, a set, which is composed of an active matrix substrate 2901' and a cover material 2904', contains one active matrix portion.

Further, the cover material 2904' is cut smaller than the active matrix substrate 2901 at this time. The purpose of doing this is to attaching an FPC (Flexible Print Circuit) to a region, indicated by the reference numeral 2906. The EL display device is completed at the point the FPC is attached.

A plurality of EL display devices can thus be manufactured from one substrate by implementing Embodiment 10. For instance, six 13 to 14 inch diagonal EL display devices or four 15 to 17 inch diagonal EL display devices may be manufactured from a 620 mm×720 mm substrate. Therefore, a large increase in throughput and a reduction in manufacturing cost can be achieved.

Embodiment 11

Figure 23:
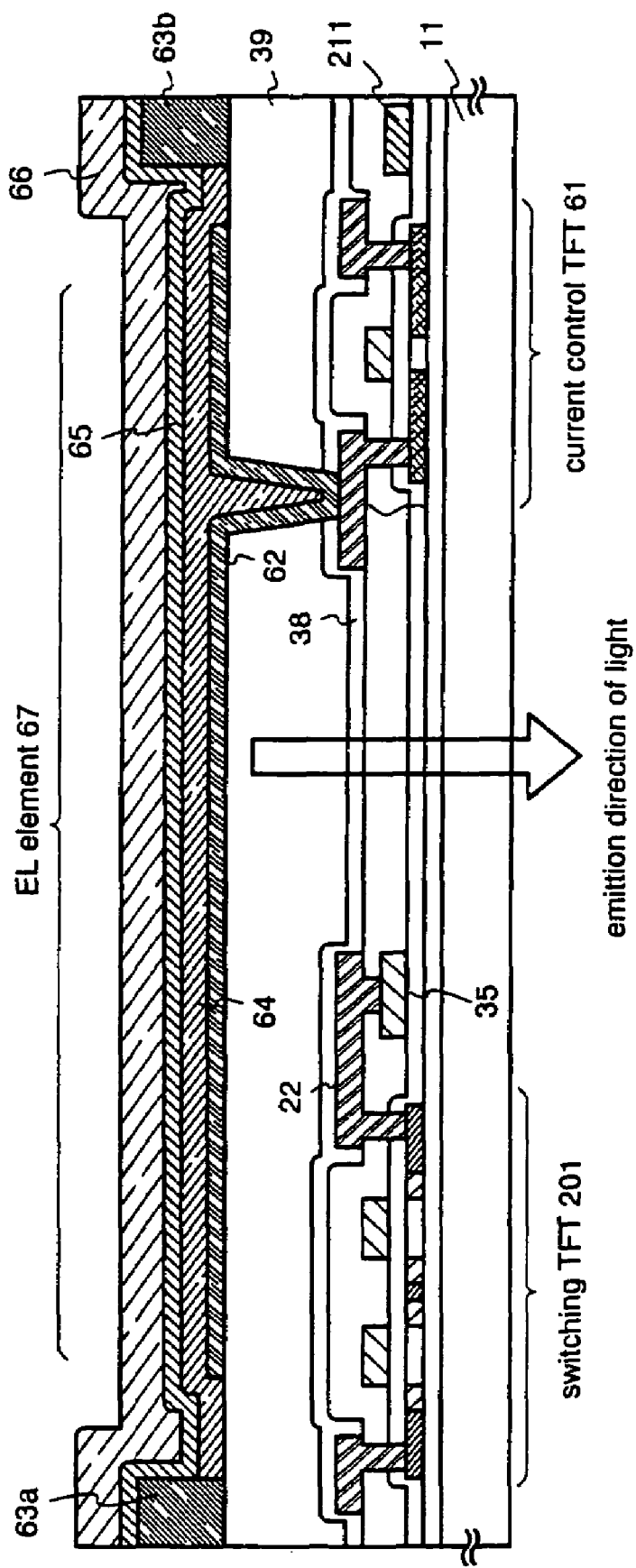
FIG. 23 is a diagram showing a cross-sectional structure of an active matrix EL display device.

A structure in which the structure of the EL element 203 in the pixel portion shown in Embodiment 1 has been reversed is explained in Embodiment 11 with reference to FIG. 23. Note that the difference between the structure of Embodiment 11 and the structure of FIG. 2 is only in the part of the EL element and the current control TFT, and therefore an explanation of the other portions is omitted.

In FIG. 23, a current control TFT 61 is formed by using a p-channel TFT whose structure is identical with that of the p-channel TFT 206 formed in accordance with the manufacturing process of Embodiment 1. Therefore, a detailed explanation of the current control TFT 61 is omitted.

In Embodiment 11, a transparent conductive film is used as a pixel electrode (anode) 62. Specifically, a conductive film made of a compound of indium oxide and zinc oxide is used. Of course, a conductive film made of a compound of indium oxide and tin oxide may also be used.

After banks 63a and 63b made of an insulating film are formed, solvent application is performed to thereby form a light emitting layer 64 made of polyvinyl carbazole. An electron injection layer 65 made of potassium acetyl acetonate is formed on the light emitting layer 64, and then a cathode 66 made of aluminum alloy is formed thereon. In this case, the cathode 66 also functions as a passivation film. An El element 67 is thus formed.

In the case of Embodiment 11, as indicated by the arrow, light generated from the light emitting layer 64 is irradiated toward the substrate with a TFT formed thereon. When forming a structure such as Embodiment 11, it is preferable to form the current control TFT 61 with a p-channel TFT. However, the current control TFT may also be formed with an n-channel TFT.

Note that it is possible to implement the constitution of Embodiment 11 by freely combining it with the constitution of any of Embodiments 1 to 7, 9, and 10. In addition, it is effective to employ the EL display device having the structure of Embodiment 11 as the display portion of the electronic equipment of Embodiment 8.

Embodiment 12

In Embodiment 12, an example of a case in which a pixel constitution shown in FIG. 24 differs from that of the circuit diagram (constitution) shown in FIG. 3B. Note that in Embodiment 12, reference numeral 71 denotes source wiring of a switching TFT 72. 73 denotes a gate wiring of the switching TFT 72, 74 denotes a current control TFT, 75 denotes a capacitor, 76 and 78 denote electric current supply lines, and 77 denotes an EL element.

It is to be noted that the capacitor 75 employs a gate capacitance (a gate capacitance formed between a gate electrode and an LDD region) of the current control TFT 74 that is formed of an n-channel TFT. Substantially, the capacitor 75 is not provided, and therefore it is indicated by a dotted line. Of course, a capacitor may be formed in a different structure.

Figure 24A:
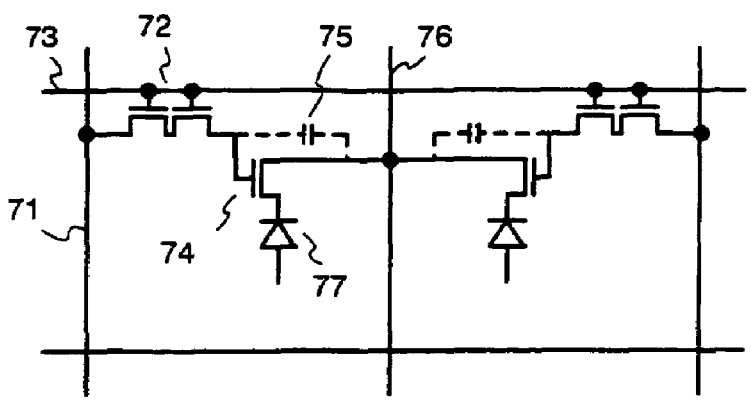
FIGS. 24A to 24C are diagrams showing compositions of a pixel of an EL display device.

FIG. 24A is an example of a case in which the electric current supply line 76 is common between two pixels. Namely, this is characterized in that the two pixels are formed having linear symmetry around the electric current supply line 76. In this case, the number of the electric current supply lines can be reduced, and therefore the pixel portion can be made with higher definition.

Figure 24B:
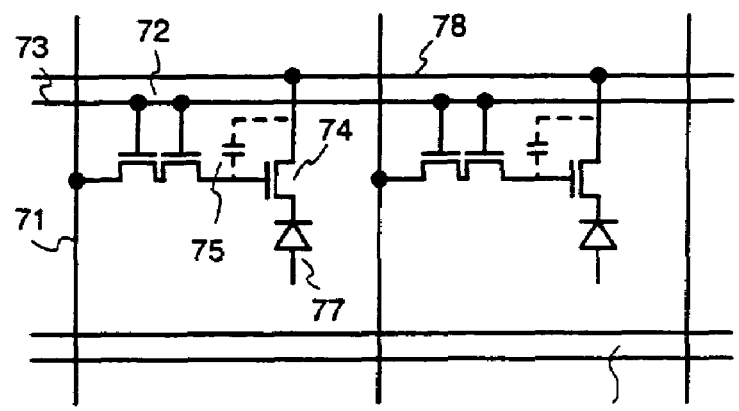

Further, FIG. 24B is an example of a case in which the electric current supply line 78 is formed parallel to the gate wiring 73. Note that in FIG. 24B, the structure is formed such that the electric current supply line 78 and the gate wiring 73 do not overlap, but provided that both are wirings formed on different layers, then they can be formed to overlap through an insulating film. In this case, the exclusive surface area can be shared by the electric current supply line 78 and the gate wiring 73, and the pixel portion can be made with higher definition.

Figure 24C:
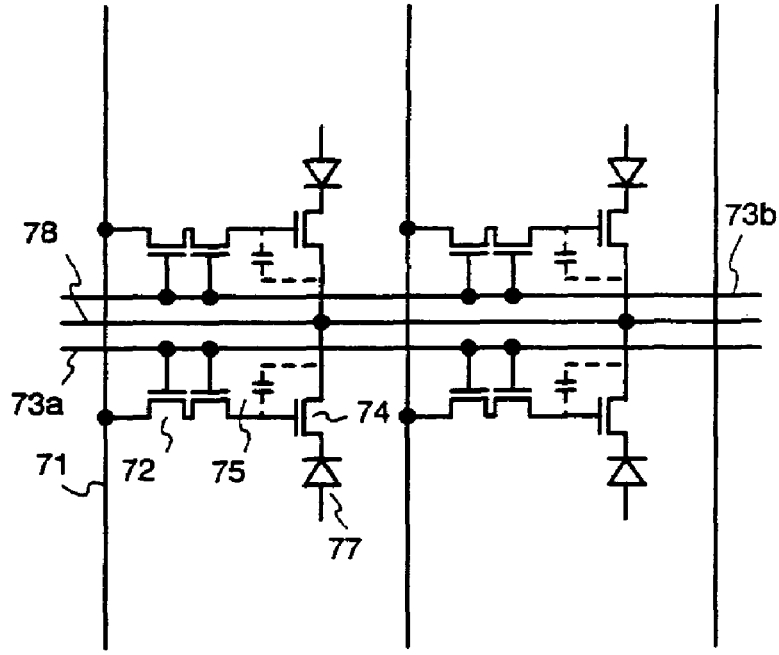

Furthermore, FIG. 24C is characterized in that the electric current supply line 78 and the gate wiring 73 are formed in parallel, similar to the structure of FIG. 24B, and additionally, in that the two pixels are formed so as to have linear symmetry around the electric current supply line 78. In addition, it is effective to form the electric current supply line 78 so as to overlap with one of the gate wirings 73. In this case, the number of electric current supply lines can be reduced, and therefore the pixel portion can be made with higher definition.

Note that it is possible to implement the constitution of Embodiment 12 by freely combining it with the constitution of any of Embodiments 1 to 7 and 9 to 11. In addition, it is effective to employ the EL display device having the pixel structure of Embodiment 12 as the display portion of the electronic equipment of Embodiment 8.

Embodiment 13

In Embodiment 11, a p-channel TFT is used as the current control TFT 61. An example of using a p-channel TFT having an LDD region is shown in Embodiment 13. A structure of the current control TFT of Embodiment 13 is shown in FIG. 25A.

Figure 25A:
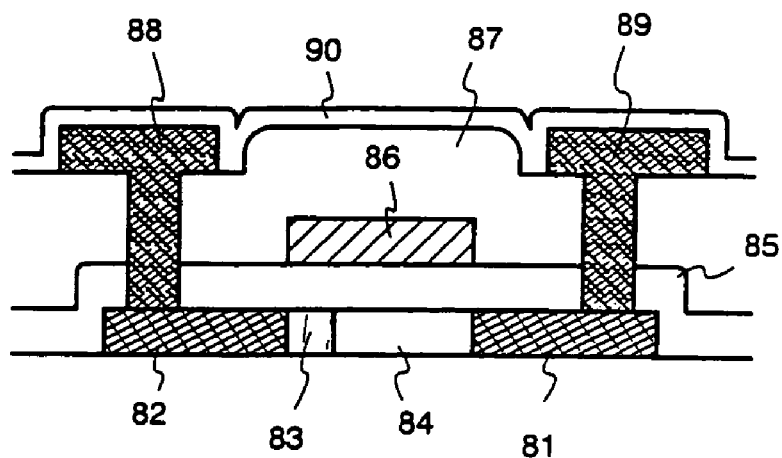
FIGS. 25A and 25B are diagrams showing a structure of a current control TFT and a composition of a pixel, respectively.

In FIG. 25A, reference numeral 81 denotes a source region, 82 denotes a drain region, 83 denotes an LDD region, 84 denotes a channel forming region, 85 denotes a gate insulating film, 86 denotes a gate electrode, 87 denotes a first interlayer insulating film, 88 denotes a source wiring, 89 denotes a drain wiring, and 90 denotes a first passivation film.

In the case of forming the structure of Embodiment 13, it is in a state where the gate electrode 86 overlaps the LDD region 83 through the gate insulating film 85, and a gate capacitance is formed therebetween. Embodiment 13 is characterized in that the gate capacitance is used as a capacitor for maintaining a gate voltage of the current control TFT.

Figure 25B:
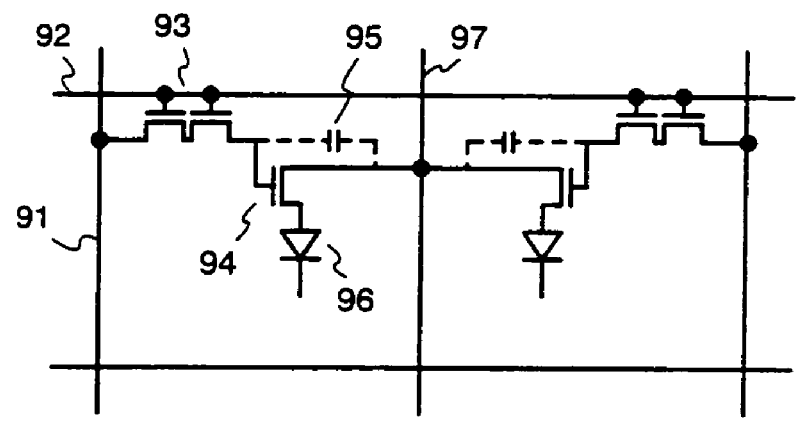

An example of a pixel constitution according to Embodiment 13 is shown in FIG. 25B. In FIG. 25B, reference numeral 91 denotes a source wiring, 92 denotes a gate wiring, 93 denotes a switching TFT, 94 denotes a current control TFT, 95 denotes a capacitor formed of a gate capacitance of the current control TFT, 96 denotes an EL element, and 97 denotes an electric current supply line.

Note that the structure of FIG. 25A is a structure in which the structure of the current control TFT and the direction of the EL element in FIG. 24A are alternated. That is, it is possible to form the pixel constitution to have the circuit configurations as shown in FIGS. 24B and 24C.

In the case of forming the current control TFT of Embodiment 13, a process of forming the LDD region of the p-channel TFT is required. However, a patterning process for forming the LDD region 83 and a doping process of a p-type impurity element may be added to the manufacturing process of Embodiment 1. When adding these processes, it is appropriate to set the concentration of the p-type impurity element contained in the LDD region 83 to between $1 \times 10^{15}$ and $1 \times 10^{18}$ atoms/cm$^3$ (typically between $5 \times 10^{16}$ and $5 \times 10^{17}$ atoms/cm$^3$).

Note that it is possible to implement the constitution of Embodiment 13 by freely combining it with the constitution of any of Embodiments 1 to 7 and 9 to 12. In addition, it is effective to employ the EL display device having the pixel structure of Embodiment 13 as the display portion of the electronic equipment of Embodiment 8.

Implementing the present invention makes it undoubtedly possible to perform film deposition of an organic EL material without the aviation curve problem, which occurs in the ink-jet method. Namely, since a high molecular organic EL material can be film deposited accurately and without any problem of positional shift, the production yield of an EL display device using a high molecular organic EL material can be increased. Further, the organic EL material is applied not in the form of a "dot" as in the ink-jet method, but in the form of a "line", and therefore, a high throughput is attained.

What is claimed is:

1. A display device comprising: a substrate; an electroluminescence layer provided over said substrate; a cover material; a filling material provided between said substrate and said cover material; a seal material provided in contact with said filling material, wherein said seal material covers at least one side edge of both said substrate and said cover material for sealing said electroluminescence layer, between said substrate and said cover material; and a drying agent provided in said filling material and said seal material.

2. A device according to claim 1 wherein said filling material functions as an adhesive for attaching said cover material over said substrate.

3. A device according to claim 1 further comprising a frame material; wherein said seal material functions as an adhesive for attaching said frame material in contact with said filling material.

4. A device according to claim 1 wherein said filling material comprises a material selected from the group consisting of epoxy resin, silicon resin, PVC, PVB and EVA.

5. A device according to claim 1 wherein said seal material comprises a light cured resin or a thermally cured resin.

6. A device according to claim 1 wherein said drying agent comprises barium oxide.

7. A light emitting device according to claim 1, wherein said organic material is one of a material selected from the group consisting of polyparaphenylene vinylene-based material, polyvinyl carbazole-based material, polyfluorenes-based material, cyano-paraphenylene vinylene, paraphenylene vinylene and polyphenylene vinylene and polyalkylphenylene.

8. A light emitting device according to claim 1, wherein said cover material comprises a material selected from the group consisting of Fiberglass-Reinforced Plastics, polyvinyl fluoride, polyester, plastic and ceramic.

9. A display device comprising: a substrate; an electroluminescence layer provided over said substrate; a cover material wherein said electroluminescence layer is interposed between said substrate and said cover material; a seal material, provided covering at least one side edge of both said substrate and said cover material for sealing said electroluminescence layer, between said substrate and said cover material; and a drying agent provided in said seal material.

10. A device according to claim 9, wherein said electroluminescence layer comprises an organic material.

11. A device according to claim 9, wherein said electroluminescence layer comprises a material selected from the group consisting of polyparaphenylene vinylene-based material, polyvinyl carbazole-based material, polyfluorenes-based material, cyano-paraphenylene vinylene, paraphenylene vinylene and polyphenylene vinylene and polyalkylphenylene.

12. A device according to claim 9, wherein said cover material comprises a material selected from the group consisting of Fiberglass-Reinforced Plastics, polyvinyl fluoride, polyester, plastic and ceramic.

13. A device according to claim 9, wherein said seal material comprises a light cured resin or a thermally cured resin.

14. A device according to claim 9, wherein said drying agent comprises barium oxide.

15. A device according to claim 9, further comprising a frame material; wherein said seal material functions as an adhesive for attaching said frame material in contact with a filling material provided between said substrate and said cover material.

16. A device according to claim 9, wherein said display device is incorporated into one selected from the group consisting of a video camera, an image playback device provided with a recording medium, a mobile computer, a personal computer, a portable telephone and an audio reproducing device.

17. A light emitting device comprising: a substrate; an electroluminescence layer comprising an organic material provided over said substrate; a first electrode and a second electrode wherein said electroluminescence layer is interposed between the first and second electrodes; a cover material wherein said electroluminescence layer is interposed between said substrate and said cover material; a seal material, provided covering at least one side edge of both said substrate and said cover material for sealing said electroluminescence layer, between said substrate and said cover material; and a drying agent provided in said seal material.

18. A light emitting device according to claim 17, wherein said organic material is one of a material selected from the group consisting of polyparaphenylene vinylene-based material, polyvinyl carbazole-based material, polyfluorenes-based material, cyano-paraphenylene vinylene, paraphenylene vinylene and polyphenylene vinylene and polyalkylphenylene.

19. A light emitting device according to claim 17, wherein said cover material comprises a material selected from the group consisting of Fiberglass-Reinforced Plastics, polyvinyl fluoride, polyester, plastic and ceramic.

20. A device according to claim 17, wherein said seal material comprises a light cured resin or a thermally cured resin.

21. A device according to claim 17, wherein said drying agent comprises barium oxide.

22. A device according to claim 17, further comprising a frame material; wherein said seal material functions as an adhesive for attaching said frame material in contact with a filling material provided between said substrate and said cover material.

23. A light emitting device according to claim 17, wherein said light emitting device is a display device incorporated into one selected from the group consisting of a video camera, an image playback device provided with a recording medium, a mobile computer, a personal computer, a portable telephone and an audio reproducing device.

24. A light emitting device comprising: a substrate; an electroluminescence layer comprising an organic material provided over said substrate; a first electrode and a second electrode wherein said electroluminescence layer is interposed between the first and second electrodes; a cover material wherein said electroluminescence layer is interposed between said substrate and said cover material; a seal material, provided covering at least one side edge of both said substrate and said cover material for sealing said electroluminescence layer, between said substrate and said cover material; and a drying agent provided in said seal material, wherein said electroluminescence layer comprises a plurality of stripe shaped light emitting layers.

25. A light emitting device according to claim 24, wherein said organic material is one of a material selected from the group consisting of polyparaphenylene vinylene-based material, polyvinyl carbazole-based material, polyfluorenes-based material, cyano-paraphenylene vinylene, paraphenylene vinylene and polyphenylene vinylene and polyalkylphenylene.

26. A light emitting device according to claim 24, wherein said cover material comprises a material selected from the group consisting of Fiberglass-Reinforced Plastics, polyvinyl fluoride, polyester, plastic and ceramic.

27. A device according to claim 24, wherein said seal material comprises a light cured resin or a thermally cured resin.

28. A device according to claim 24, wherein said drying agent comprises barium oxide.

29. A device according to claim 24, further comprising a frame material; wherein said seal material functions as an adhesive for attaching said frame material in contact with a filling material provided between said substrate and said cover material.

30. A device according to claim 24, wherein each of the plurality of stripe shaped light emitting layers emits one of a red light, a green light, and a blue light.

31. A light emitting device according to claim 24, wherein said light emitting device is a display device incorporated into one selected from the group consisting of a video camera, an image playback device provided with a recording medium, a mobile computer, a personal computer, a portable telephone and an audio reproducing device.

32. A light emitting device comprising: a substrate; an electroluminescence layer comprising an organic material provided over said substrate; a first electrode and a second electrode wherein said electroluminescence layer is interposed between the first and second electrodes; a cover material wherein said electroluminescence layer is interposed between said substrate and said cover material; a seal material, provided covering at least one side edge of both said substrate and said cover material for sealing said electroluminescence layer, between said substrate and said cover material; and a drying agent provided in said seal material, wherein said electroluminescence layer comprises a first plurality of stripe shaped light emitting layers and a second plurality of stripe shaped light emitting layers which are orthogonal to the first plurality of stripe shaped light emitting layers.

33. A light emitting device according to claim 32, wherein said organic material is one of a material selected from the group consisting of polyparaphenylene vinylene-based material, polyvinyl carbazole-based material, polyfluorenes-based material, cyano-paraphenylene vinylene, paraphenylene vinylene and polyphenylene vinylene and polyalkylphenylene.

34. A light emitting device according to claim 32, wherein said cover material comprises a material selected from the group consisting of Fiberglass-Reinforced Plastics, polyvinyl fluoride, polyester, plastic and ceramic.

35. A device according to claim 32, wherein said seal material comprises a light cured resin or a thermally cured resin.

36. A device according to claim 32, wherein said drying agent comprises barium oxide.

37. A device according to claim 32, further comprising a frame material; wherein said seal material functions as an adhesive for attaching said frame material in contact with a filling material provided between said substrate and said cover material.

38. A device according to claim 32, wherein the first plurality of stripe shaped light emitting layers each emit one of a red light, a green light, and a blue light.

39. A device according to claim 32, wherein the second plurality of stripe shaped light emitting layers each emit one of a red light, a green light, and a blue light.

40. A light emitting device according to claim 32, wherein said light emitting device is a display device incorporated into one selected from the group consisting of a video camera, an image playback device provided with a recording medium, a mobile computer, a personal computer, a portable telephone and an audio reproducing device.

* * * * *